United States Patent
Wang et al.

(10) Patent No.: US 6,773,974 B2
(45) Date of Patent: *Aug. 10, 2004

(54) METHOD OF FORMING A SEMICONDUCTOR ARRAY OF FLOATING GATE MEMORY CELLS AND STRAP REGIONS

(75) Inventors: Chih Hsin Wang, San Jose, CA (US); Amitay Levi, Cupertino, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/406,917

(22) Filed: Apr. 4, 2003

(65) Prior Publication Data

US 2003/0189223 A1 Oct. 9, 2003

Related U.S. Application Data

(62) Division of application No. 10/040,724, filed on Oct. 31, 2001, now Pat. No. 6,566,706.

(51) Int. Cl.[7] .......................................... H01L 21/8238
(52) U.S. Cl. ..................... 438/201; 438/211; 438/257; 438/591; 438/593; 257/239; 257/261; 257/315
(58) Field of Search ................................ 438/201, 211, 438/216, 241, 257, 258, 260–266, 591, 593; 257/239, 261, 298, 315–326

(56) References Cited

U.S. PATENT DOCUMENTS

| | | |
|---|---|---|
| 4,757,360 A | 7/1988 | Faraone |
| 4,794,565 A | 12/1988 | Wu et al. |
| 4,882,707 A | 11/1989 | Mizutani |
| 4,931,847 A | 6/1990 | Corda |
| 4,947,221 A | 8/1990 | Stewart et al. |
| 5,021,848 A | 6/1991 | Chiu |
| 5,029,130 A | 7/1991 | Yeh |
| 5,041,886 A | 8/1991 | Lee |
| 5,101,250 A | 3/1992 | Arima et al. |
| 5,268,319 A | 12/1993 | Harari |
| 5,384,277 A | 1/1995 | Hsu et al. |
| 5,429,965 A | 7/1995 | Shimoji |
| 5,544,103 A | 8/1996 | Lambertson |
| 5,572,054 A | 11/1996 | Wang et al. |
| 5,780,341 A | 7/1998 | Ogura |
| 5,780,892 A | 7/1998 | Chen |
| 5,789,293 A | 8/1998 | Cho et al. |
| 5,796,139 A | 8/1998 | Fukase |
| 5,808,328 A | 9/1998 | Nishizawa |
| 5,811,853 A | 9/1998 | Wang |
| 5,814,853 A | 9/1998 | Chen |

(List continued on next page.)

FOREIGN PATENT DOCUMENTS

EP    0389721    10/1990

*Primary Examiner*—David Nelms
*Assistant Examiner*—Andy Huynh
(74) *Attorney, Agent, or Firm*—Gray Cary Ware & Freidenrich LLP

(57) ABSTRACT

A self aligned method of forming a semiconductor memory array of floating gate memory cells in a semiconductor substrate, along with strap regions interlaced within the array. The array includes word lines and source lines that connect together control gates and source regions from memory cells contained in row within the array. The strap regions include word line strap cells through which the word lines traverse, wherein the word lines completely traverse across the strap regions, and source line strap cells in which the source lines terminate without completely traversing across the strap region. A first plurality of conductive metal contacts are each connected to one of the word lines in one of the word line strap cells. A second plurality of conductive metal contacts are each connected to one of the source lines in one of the source line strap cells.

52 Claims, 16 Drawing Sheets

U.S. PATENT DOCUMENTS

| | | |
|---|---|---|
| 5,851,881 A | 12/1998 | Lin et al. |
| 6,091,104 A | 7/2000 | Chen |
| 6,103,573 A | 8/2000 | Harari et al. |
| 6,140,182 A | 10/2000 | Chen |
| 6,180,508 B1 | 1/2001 | Lowrey |
| 6,222,227 B1 | 4/2001 | Chen |
| 6,285,088 B1 | 9/2001 | Madan |
| 6,372,629 B1 | 4/2002 | Lowrey |
| 6,426,526 B1 | 7/2002 | Divakaruni et al. |
| 6,437,388 B1 | 8/2002 | Radens et al. |
| 6,525,371 B2 | 2/2003 | Johnson et al. |
| 2003/0139010 A1 * | 7/2003 | Wang .................. 438/257 |

* cited by examiner

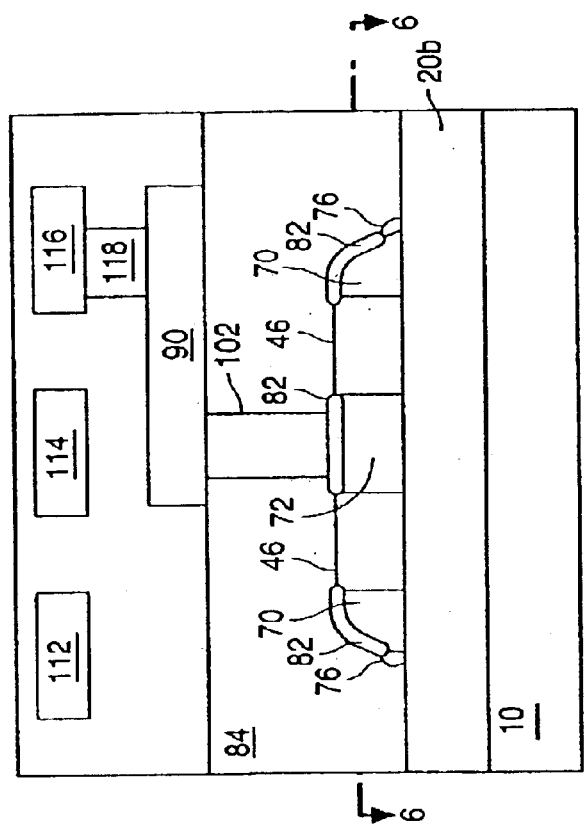
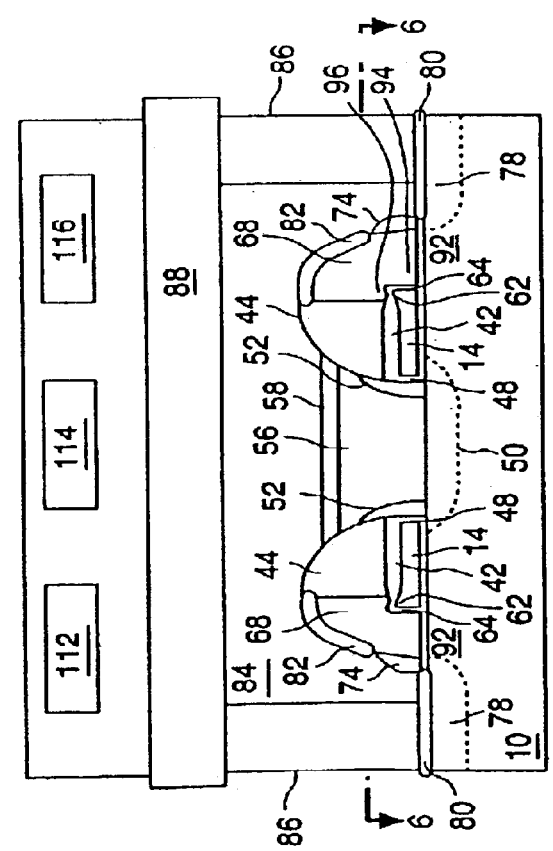

METHOD OF FORMING A SEMICONDUCTOR ARRAY OF FLOATING GATE MEMORY CELLS AND STRAP REGIONS

This application is a divisional of U.S. application Ser. No. 10/040,724, filed Oct. 31, 2001 now U.S. Pat. No. 6,566,706.

TECHNICAL FIELD

The present invention relates to a method of forming strap regions to make electrical contacts with memory cells in an array of semiconductor non-volatile memory cells, and more particularly, in the preferred embodiment, to an array of floating gate memory cells of the split gate type.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type, or a combination thereof.

One of the problems facing the manufacturability of semiconductor floating gate memory cell arrays has been the alignment of the various components such as source, drain, control gate, and floating gate. As the design rule of integration of semiconductor processing decreases, reducing the smallest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, self alignment minimizes the number of masking steps necessary to form memory cell structures, and enhances the ability to scale such structures down to smaller dimensions.

In the manufacture of memory cell arrays, it is also known to form cell elements that extend across the entire array of memory cells. For example, with an array having interlaced columns of isolation and active regions, with a plurality of memory cells in each active region, memory cell elements such as control gates, source regions, drain regions etc. can be formed to continuously extend across an entire row or column of memory cells. In order to ensure an equalized voltage on such elements for all the memory cells in the target row/column, strap regions have been used to provide multiple electrical connections along the length of continuously formed memory cell elements, so that uniform voltages are applied to all the memory cells in the affected row/column.

FIG. 1 illustrates a known strap region design. Strap region 1 is formed along side a memory cell array 2. The memory cell array 2 includes columns of active regions 3 interlaced with columns of isolation regions 4. Rows of memory cell pairs 5 are formed with word lines 6 and source lines 7 extending along the memory cell rows, with each pair of memory cells having two word lines 6 and sharing a single source line 7. (Those of skill in the art will recognize that the term source and drain may be interchanged. Further, the word line is connected to the control gate of the floating gate memory cell. Thus, the term control gate or control gate line may also be used interchangeably with the term word line). Typically, the word line and the source lines are made of polysilicon or polysilicide or salicide material. Thus, pure metal lines are used to strap these lines. Strap cells 8 are formed on the control gates 6 and source lines 7 as they traverse the strap region 1. Electrical contacts 9a and 9b are then formed onto the control gate (word) lines 6 and source lines 7 respectively by metal lines (not shown) traversing in the word line direction positioned above the array shown in FIG. 1 and electrically insulated therefrom for supplying the desired voltages to the various rows of control gates 6 and source lines 7.

Ideally, for larger memory arrays, a plurality of strap regions are interlaced within the memory cell array (e.g. one strap region for every 128 cells in the word line direction). Preferably, the strap regions are formed simultaneously with the process steps used to make the memory cell array.

As device geometries get smaller, it is increasingly difficult to reliably form electrical connections to the strap regions 8. The word lines 6 are very close to the source lines 7, and get even closer with smaller device geometries. As the distance between the control gate lines 6 and source line 7 shrinks, it becomes more difficult to form contacts 9a and 9b properly. For example, just a small shift of one of the control gate line 6 contacts toward an adjacent source line 7 would result in the contact being formed over both a word line 6 and a source line 7, thus shorting the two together. Further, there is simply no room to enlarge and separate the strap cells to increase the tolerance of the contact formation steps.

Thus, there is a need for a strap cell design, and a manufacturing method thereof, that minimizes the risk of shorting source lines 7 and word lines 6 together during the formation of the strap cells, and/or during the formation of electrical contacts connected thereto. There is also a need to form such strap cells using the same processing steps that are used to form the memory cells in the active regions.

SUMMARY OF THE INVENTION

The present invention provides a memory cell array with a strap region that minimizes the risk of shorting the source and word lines together, and maximizes the spacing of contacts in the strap region to enable further scaling of device geometries.

The present invention is an array of electrically programmable and erasable memory devices, which includes a substrate of semiconductor material having a first conductivity type, an array of memory cells formed on the substrate, a first plurality of parallel spaced apart lines of a conductive material formed over the substrate and electrically coupled to the memory cells, a second plurality of parallel spaced apart lines of a conductive material formed over the substrate and electrically connected to the memory cells, and a strap region formed on the substrate and adjacent to the memory cell array. The strap region includes first strap cells through which the first plurality of conductive material lines traverse, wherein the first plurality of conductive material lines completely traverse across the strap region, a first plurality of conductive metal contacts each of which is connected to one of the first plurality of conductive material lines in one of the first strap cells, second strap cells in which the second plurality of conductive material lines terminate without completely traversing across the strap region, and a second plurality of conductive metal contacts each of which is connected to one of the second plurality of conductive material lines in one of the second strap cells.

In another aspect of the present invention, an array of electrically programmable and erasable memory devices includes a substrate of semiconductor material having a first conductivity type, an array of memory cells formed on the substrate, a first plurality of parallel spaced apart lines of conductive material formed over the substrate and electrically coupled to the memory cells, a second plurality of parallel spaced apart lines of conductive material formed over the substrate and electrically connected to the memory cells, and a plurality of strap regions each formed on the substrate and disposed in an interlaced fashion between adjacent portions of the memory cell array. Each of the strap regions includes first strap cells through which the first plurality of conductive material lines traverse, wherein the first plurality of conductive material lines completely traverse across the strap region, a first plurality of conductive metal contacts each of which is connected to one of the first plurality of conductive material lines in one of the first strap cells, second strap cells in which the second plurality of conductive material lines terminate without completely traversing across the strap region, and a second plurality of conductive metal contacts each of which is connected to one of the second plurality of conductive material lines in one of the second strap cells.

In yet another aspect of the present invention, a method of forming an array of memory devices includes the steps of forming an array of memory cells on a semiconductor substrate having a first conductivity type, forming a first plurality of parallel spaced apart lines of conductive material over the substrate that are electrically coupled to the memory cells, forming a second plurality of parallel spaced apart lines of conductive material over the substrate and electrically connected to the memory cells, and forming a strap region on the substrate and adjacent to the memory cell array. The formation of the strap region includes the steps of forming first strap cells in the strap region through which the first plurality of conductive material lines traverse, wherein the first plurality of conductive material lines completely traverse across the strap region, forming a first plurality of conductive metal contacts each of which is connected to one of the first plurality of conductive material lines in one of the first strap cells, forming second strap cells in the strap region in which the second plurality of conductive material lines terminate without completely traversing across the strap region, and forming a second plurality of conductive metal contacts each of which is connected to one of the second plurality of conductive material lines in one of the second strap cells.

In yet one more aspect of the present invention, a method of forming an array of memory devices includes the steps of forming an array of memory cells on a semiconductor substrate having a first conductivity type, forming a first plurality of parallel spaced apart lines of conductive material over the substrate that are electrically coupled to the memory cells, forming a second plurality of parallel spaced apart lines of conductive material over the substrate and electrically connected to the memory cells, and forming a plurality of strap regions on the substrate in an interlaced fashion between adjacent portions of the memory cell array. The formation of each of the strap regions includes the steps of forming first strap cells in the strap region through which the first plurality of conductive material lines traverse, wherein the first plurality of conductive material lines completely traverse across the strap regions, forming a first plurality of conductive metal contacts each of which is connected to one of the first plurality of conductive material lines in one of the first strap cells, forming second strap cells in the strap region in which the second plurality of conductive material lines terminate without completely traversing across the strap region, and forming a second plurality of conductive metal contacts each of which is connected to one of the second plurality of conductive material lines in one of the second strap cells.

Other objects and features of the present invention will become apparent by a review of the specification, claims and appended figures.

BRIEF DESCRIPTION OF THE DRAWINGS

FIGS. 3A–3M are cross sectional views taken along the line 2—2 of FIG. 2C showing in sequence the next step(s) in the processing of the structure shown in FIG. 2C, in the formation of a non volatile memory array of floating memory cells of the split gate type.

FIGS. 4A–4M are cross sectional views of the strap regions showing in sequence the next step(s) in the processing of the strap region structure imaged by the line 4B—4B portion of the mask of FIG. 5.

DETAILED DESCRIPTION OF THE PREFERRED EMBODIMENTS

The present invention is an array of non-volatile memory cells having a strap cell design, and method of making such strap cells, with enhanced contact formation. The strap cells are formed using the same processing steps that are used to form the array of memory cells. The strap cell regions containing the strap cells are interlaced among an array of non-volatile memory cells having word lines and source lines that extend across rows of memory cells. Co-pending patent application Ser. No. 09/917,023, filed on Jul. 26, 2001, which is commonly assigned to the assignee of the present invention, and whose disclosure is hereby incorporated by reference herein, discloses a self aligned method of forming a split gate non-volatile memory cell array. In the preferred embodiment, the strap cell regions of the present invention will be disclosed in the context of forming such a split gate non-volatile memory cell array, although it should be apparent that the present invention can also be practiced with other types of array of memory cells, in which the array is traversed by a row of source (or drain) line and parallel thereto a row of word line.

Figure 2A:
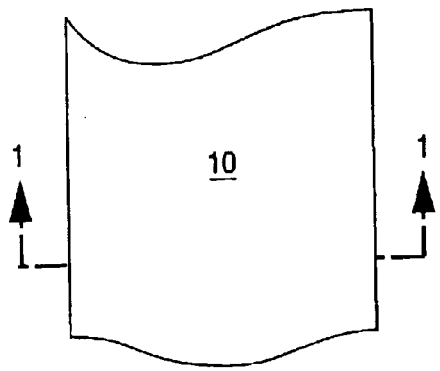
FIG. 2A is a top view of a semiconductor substrate used in the first step of the method of present invention to form isolation regions.
Figure 2B:
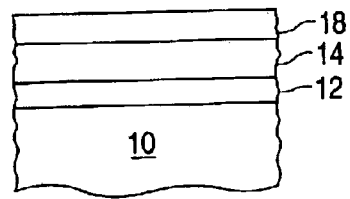
FIG. 2B is a cross sectional view of the structure taken along the line 1—1 showing the initial processing steps of the present invention.

Referring to FIG. 2A there is shown a top plan view of a semiconductor substrate 10 (or a semiconductor well), which is preferably of P type and is well known in the art. A first layer of insulation material 12, such as silicon dioxide (oxide), is deposited thereon as shown in FIG. 2B. The first insulation layer 12 is formed on the substrate 10 by well known techniques such as oxidation or deposition (e.g. chemical vapor deposition or CVD), forming a layer of oxide preferably 80 Å thick. A first layer of polysilicon 14 (hereinafter "poly") is deposited on top of the first layer of insulation material 12 (e.g. 700 to 800 Å thick). The deposition and formation of the first polysilicon layer 14 on the first insulation layer 12 can be made by a well known process such as Low Pressure CVD or LPCVD. A silicon nitride layer 18 (hereinafter "nitride") is deposited over the polysilicon layer 14, preferably by CVD (e.g. 1000 Å thick). This nitride layer 18 is used to define the active regions during isolation formation. Of course, all of the forgoing described parameters and the parameters described hereinafter, depend upon the design rules and the process technology generation. What is described herein is for the 0.18 micron process. However, it will be understood by those skilled in the art that the present invention is not limited to any specific process technology generation, nor to any specific value in any of the process parameters described hereinafter.

Figure 2C:
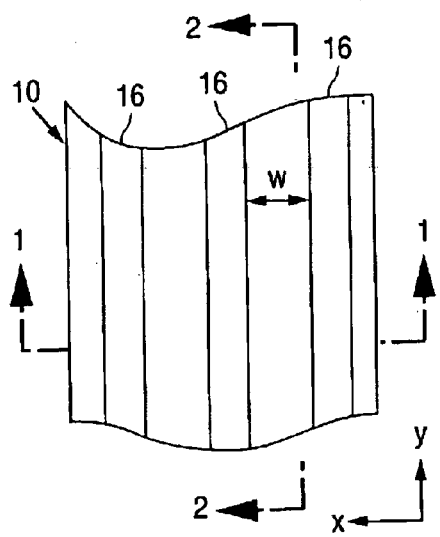
FIG. 2C is a top view of the structure showing the next step in the processing of the structure of FIG. 2B, in which isolation regions are formed.
Figure 2D:
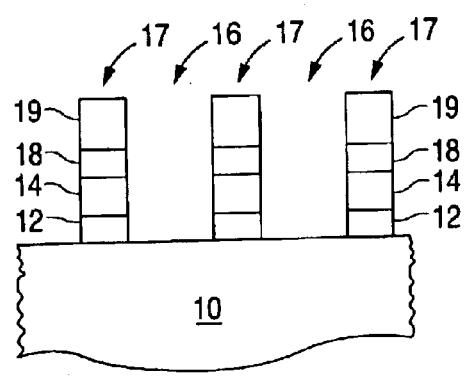
FIG. 2D is a cross sectional view of the structure in FIG. 2C taken along the line 1—1 showing the isolation stripes formed in the structure.

Once the first insulation layer 12, the first polysilicon layer 14, and the silicon nitride 18 have been formed, suitable photo-resistant material 19 is applied on the silicon nitride layer 18 and a masking step is performed to selectively remove the photo-resistant material from certain regions (stripes 16). Where the photo-resist material 19 is removed, the silicon nitride 18, the polysilicon 14 and the underlying insulation material 12 are etched away in stripes 16 formed in the Y or column direction, as shown in FIG. 2C, using standard etching techniques (i.e. anisotropic etch processes). The distance W between adjacent stripes 16 can be as small as the smallest lithographic feature of the process used. Where the photo resist 19 is not removed, the silicon nitride 18, the first polysilicon region 14 and the underlying insulation region 12 are maintained. The resulting structure is illustrated in FIG. 2D, with active regions 17 interlaced with isolation regions 16. As will be described, there are two embodiments in the formation of the isolation regions: LOCOS and STI. In the STI embodiment, the etching continues into the substrate 10 to a predetermined depth.

The structure is further processed to remove the remaining photo resist 19. Then, an isolation material 20a or 20b, such as silicon dioxide, is formed in the regions or "grooves" 16. The nitride layer 18 is then selectively removed to form the structure shown in FIG. 2E. The isolation can be formed via the well known LOCOS process resulting in the local field oxide 20a (e.g. by oxidizing the exposed substrate), or it can be formed via a shallow trench process (STI) resulting in silicon-dioxide being formed in the region 20b (e.g. by depositing an oxide layer, followed by a Chemical-Mechanical-Polishing or CMP etch). It should be noted that during the LOCOS formation, a spacer may be necessary to protect the side walls of poly layer 14 during the formation of the local field oxide.

Figure 2E:
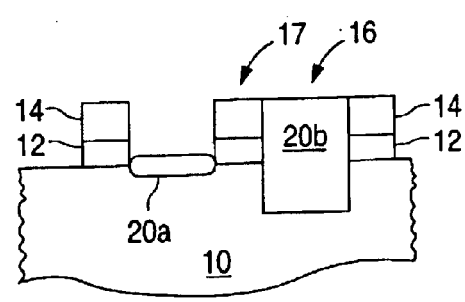
FIG. 2E is a cross sectional view of the structure in FIG. 2C taken along the line 1—1 showing the two types of isolation regions that can be formed in the semiconductor substrate: LOCOS or shallow trench.

The remaining first polysilicon layer 14 and the underlying first insulation material 12 form the active regions. Thus, at this point, the substrate 10 has alternating stripes of active regions and isolation regions with the isolation regions being formed of either LOCOS insulation material 20a or shallow trench insulation material 20b. Although FIG. 2E shows the formation of both a LOCOS region 20a and a shallow trench region 20b, only one of the LOCOS process (20a) or the shallow trench process (20b) will be used. In the preferred embodiment, the shallow trench 20b will be formed. Shallow trench 20b is preferable because it can be more precisely formed at smaller design rules.

The structure in FIG. 2E represents a self aligned structure, which is more compact than a structure formed by a non self-aligned method. A non self-aligned method of forming the structure shown in FIG. 2E, which is well known and is conventional, is as follows. Regions of isolation 20 are first formed in the substrate 10. This can be done by depositing a layer of silicon nitride on the substrate 10, depositing photo-resist, patterning the silicon nitride using a first masking step to expose selective portions of the substrate 10, and then oxidizing the exposed substrate 10 using either the LOCOS process or the STI process where silicon trench formation and trench fill are involved. Thereafter, the silicon nitride is removed, and a first layer of silicon dioxide 12 (to form the gate oxide) is deposited over the substrate 10. A first layer of polysilicon 14 is deposited over the gate oxide 12. The first layer of polysilicon 14 is then patterned using a second masking step and selective portions removed. Thus, the polysilicon 14 is not self aligned with the regions of isolation 20, and a second masking step is required. Further, the additional masking step requires that the dimensions of the polysilicon 14 have an alignment tolerance with respect to the regions of isolation 20. It should be noted that the non self-aligned method does not utilize nitride layer 18.

In the above processing steps, one or more isolation regions are designated as strap regions 24, in which strap cells for the word lines and source lines will be formed. Again, as used herein, the term source line is meant to include drain line as well. The width of the strap regions 24 is preferably wider than the width of the isolation regions 16 to accommodate the formation of the strap cells therein. Thus, the resulting structure includes sets of interlaced columns of active and isolation regions, with columns of strap regions 24 interlaced between the sets of active/isolation regions. In the preferred embodiment, a strap region column is formed between every set of 128 or 256 active and isolation regions 17/16.

With the structure shown in FIG. 2E made using either the self aligned method or the non self-aligned method, the structure is further processed as follows. FIGS. 3A to 3M show the cross sections of the active region structure from a view orthogonal to that of FIGS. 2B and 2E, and FIGS. 4A to 4M show the cross sections of the strap region structure from the same orthogonal view, as the next steps in the process of the present invention are performed concurrently on both regions.

Figure 3A:
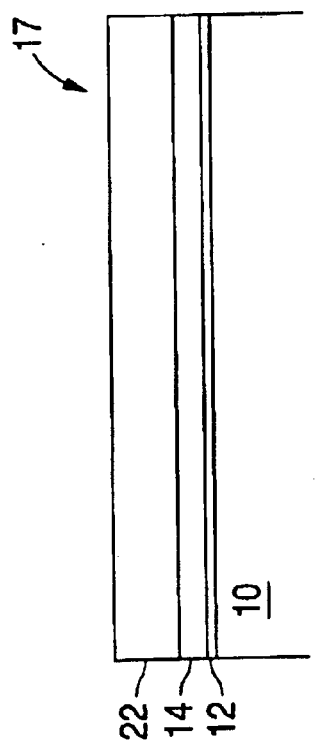
Figure 4A:
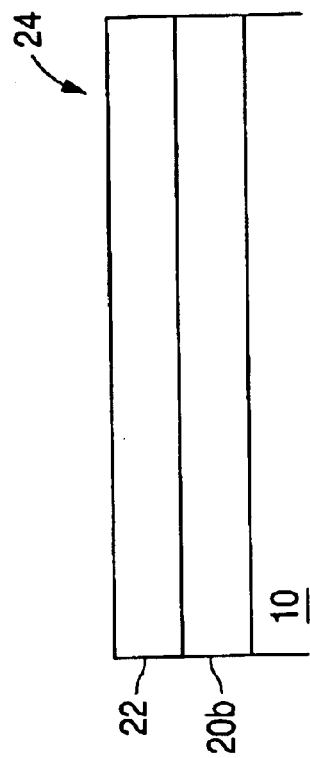

An insulation layer 22 is first formed on the structure. Specifically, a nitride layer 22 is deposited across the entire surface of the structure (e.g. 3000 Å thick). The resulting active region structure is shown in FIG. 3A, and the resulting strap region structure is shown in FIG. 4A.

Figure 5:
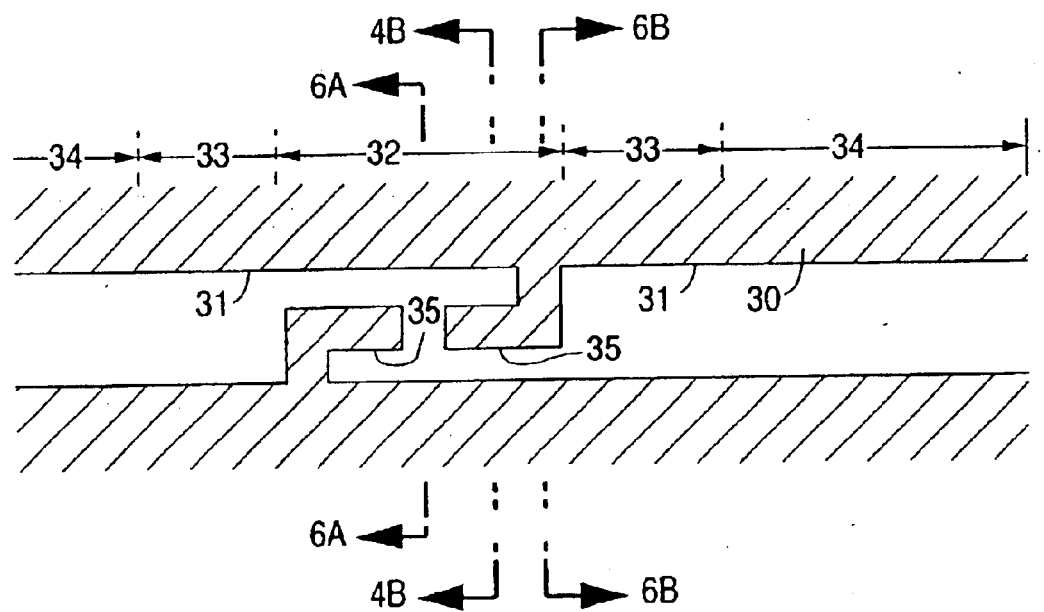
FIG. 5 is a top view of a portion of the mask used to form the first trenches in the active regions and the 'H' shaped strap cells in the strap regions.

A masking operation is performed on both the active/isolation regions 17/16 and the strap regions 24, by first applying photo-resist 23 on top of the nitride layer 22. A masking step is applied to the structure using a mask 30, as illustrated in FIG. 5. Mask 30 is formed of an opaque masking material (such as metal) that contains a patterned aperture 31 for defining masking regions on the structure from which material is to be removed. Mask 30 includes a first mask region 32 (for defining the word line (WL) strap cells), a second mask region 33 (for defining the source line (SL) strap cells), and a third mask region 34 (for forming the memory cell array). The mask 30 shown in FIG. 5 is used to define a single strap region row and single row of memory cells. Thus, a mask having an array of geometries 30 is used to define the memory cell array including the strap regions of the present invention.

Figure 3B:
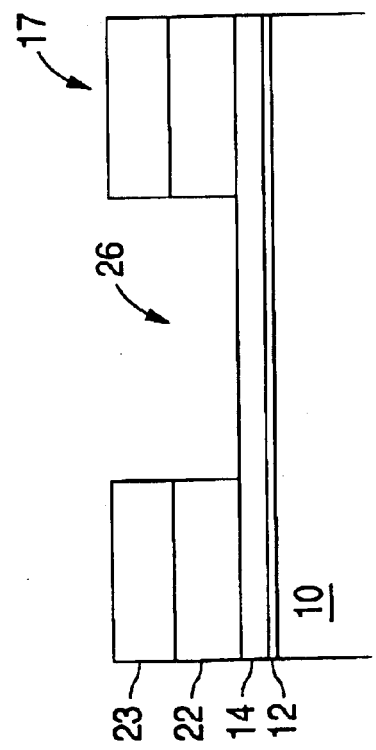

The mask regions 34 include single linear apertures for defining parallel stripe masking regions over the active and isolation regions 17/16, which extend in the X or the row direction. The distance between adjacent stripes can be a size determined by the needs of the device to be fabricated. After mask regions 34 are imaged onto the active regions 17 (shown in FIG. 3A), the photo resist 23 in the exposed masking regions is removed (i.e. stripes in the row direction), leaving rows of the nitride layer 26 exposed. The exposed nitride layer portions are removed using a nitride anisotropic etch process until the poly layer 14 is observed, which acts as an etch stop. The portions of layers 12, 14 and 22 still underneath the remaining photo resist 23 are unaffected by this etch process. It will become evident from the following description that the process of the present invention creates columns of multiple pairs of mirror memory cells. For each such pair of memory cells, this nitride etch process results in the formation of a single first trench 26 that extends down to polysilicon layer 14, as shown in FIG. 3B.

Figure 4B:
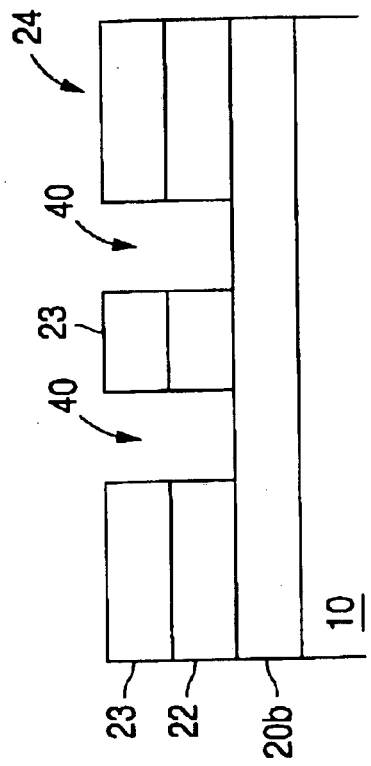

The mask regions 32 each include a single linear aperture into which a pair of L shaped members 35 protrude. Members 35 extend out from opposing sides of aperture 31, and bend toward each other, to form an 'H' shaped aperture (the shape in the form of the letter 'H' can be seen by rotating FIG. 5 by 90 degrees). Mask regions 32 are used to define WL strap cells in the strap regions 24 that are each aligned to one of the rows of memory cells in the array. The mask regions 32 are imaged onto the strap regions 24, where an 'H' shaped trench pattern is formed in each row of the strap regions 24 by the nitride anisotropic etch step. FIG. 4B illustrates the cross section view of the strap regions 24 after the nitride etch step, that are imaged by the line 4B—4B portion of the 'H' shaped mask pattern of FIG. 5. The two parallel portions of the 'H' shaped pattern result in the formation of a pair of trenches 40 in the strap regions 24, as shown in FIG. 4B.

The mask regions 33 each include a single linear aperture for forming the SL strap cells in the strap regions 24. Each SL strap cell is aligned to one of the rows of memory cells in the array. The mask regions 33 are each imaged down onto the structure between one of the 'H' shaped trench patterns and one of the rows of memory cells, as later described and illustrated.

Figure 3C:
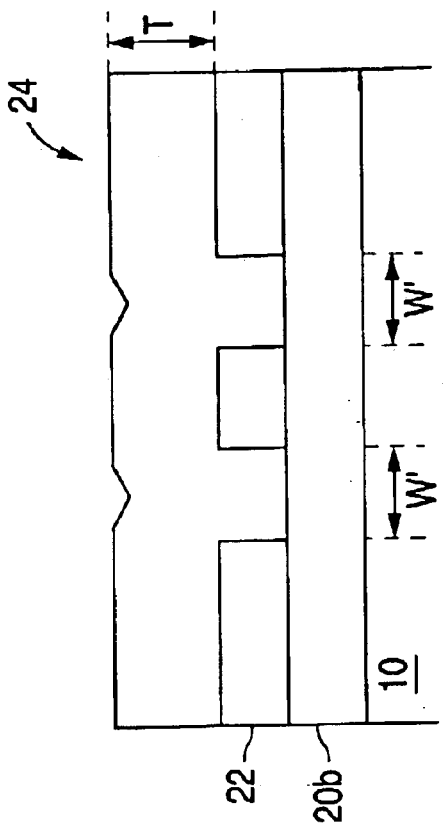
Figure 4C:
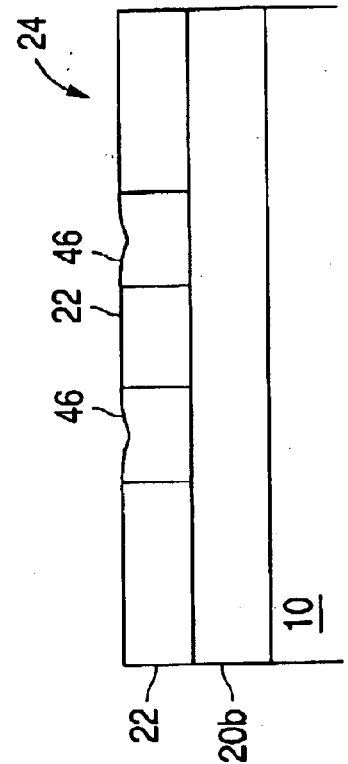
Figure 3D:
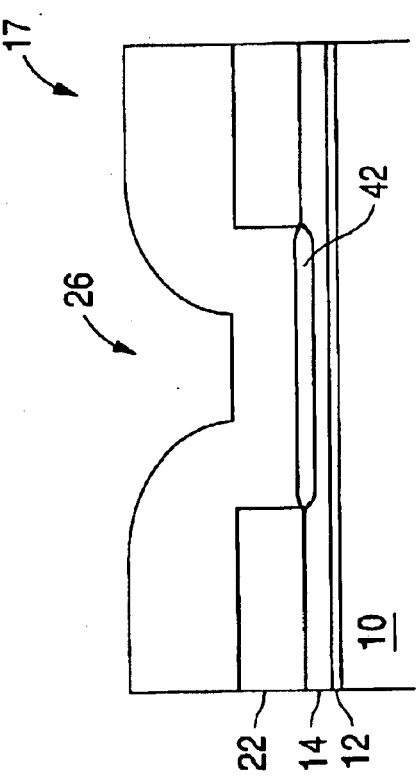
Figure 4D:
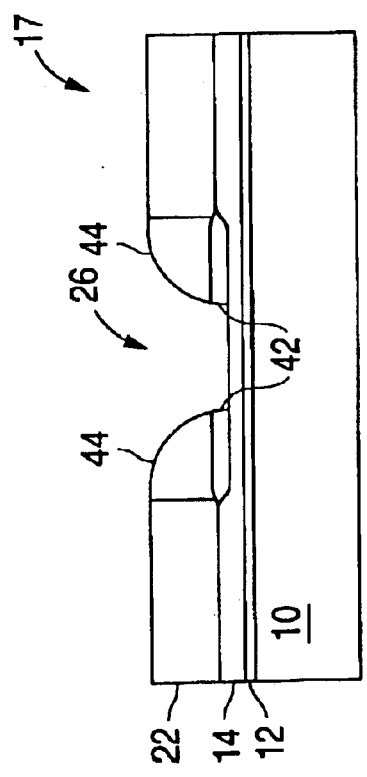

The residual photo-resist 23 is removed from the structure, which is followed by an oxidation process. For the active regions 17, this oxidation process oxidizes the exposed portions of poly layer 14 inside of trenches 26 to form a lens shaped oxide layer 42 over poly layer 14 (see FIG. 3C). While not shown, an optional poly etch process can be performed before the formation of layer 42. This optional customized anisotropic poly etch process etches away a portion of the top surface of poly layer 14, but leaves a taper shape in that top surface in the area next to the remaining nitride layer 22. Oxide spacers 44 are then formed inside trenches 26. The formation of spacers is well known in the art, and includes depositing a material over the contour of a structure (as shown in FIG. 3C), followed by an anisotropic etch process (e.g. RIE), whereby the material is removed from horizontal surfaces of the structure, while the material remains largely intact on vertically oriented surfaces of the structure. To form oxide spacers 44, a thick layer of oxide is deposited over the structure, followed by an anisotropic oxide etch, which removes the deposited oxide except for spacers 44 inside trenches 26. This oxide etch step also removes the center portion of oxide layer 42 from each of the trenches 26. The oxide etch step uses the nitride layer 22 as the etch stop. The resulting structure in the active regions 17 is shown in FIG. 3D.

For the strap regions 24, the oxidation process used to form oxide layer 42 in the active regions 17 has no affect. The oxide deposition and etch steps used to form spacers 44 in the active regions end up filling trenches 40 in the strap regions 24 with oxide to form oxide blocks 46. Specifically, the oxide deposition completely fills trenches 40 (see FIG. 4C) and the oxide etch removes the oxide outside of trenches 40 (see FIG. 4D). Trenches 40 are filled solid with oxide instead of with oxide spacers along their sidewalls so long as trenches 40 have a sufficiently narrow width W'. For example, in many applications, if the width W' of each trench 40 is no greater than approximately twice the thickness T of the deposited oxide, then the trenches 40 will be filled with oxide to form oxide blocks 46. Therefore, for the preferred embodiment, the width of the trenches in the trench pattern formed by imaging patterned aperture onto the strap regions 24 is narrow enough to ensure that the trench pattern is filled with oxide by the oxide deposition/ etch steps.

Figure 3E:
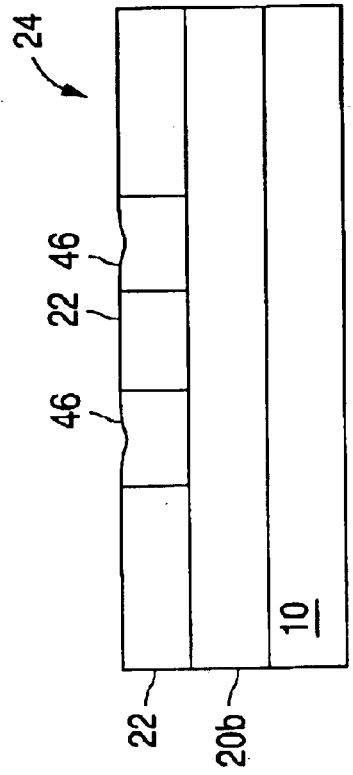
Figure 4E:
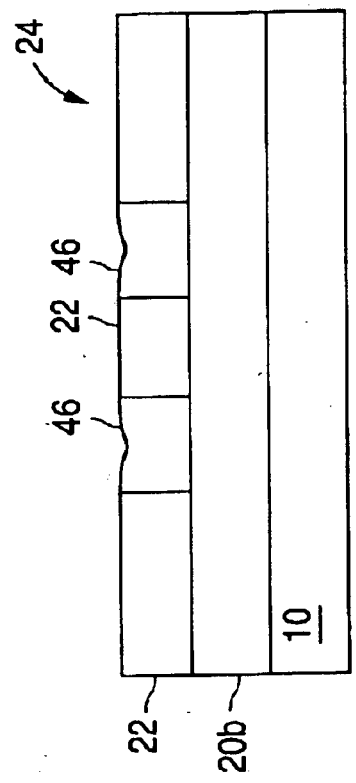

An anisotropic poly etch process is then performed on the structure. For the active regions 17, this etch removes portions of the poly layer 14 that are exposed between the opposing insulation spacers 44 at the bottom of trenches 26. The oxide layer 12 acts as an etch stop. This poly etch has no effect on the strap regions. A thin oxide etch is then performed, which removes the exposed portions of thin oxide layer 12 between spacers 44 at the bottom of trenches 26 to expose substrate 10. The use of spacers 44 allows the formation of trenches 26 having a width at the poly layer 14 that is less than the width of the masking step used to initially define the tops of trenches 26. The resulting active region structure is illustrated in FIG. 3E. The oxide etch removes a negligible amount of the oxide blocks 46 in strap regions 24, as shown in FIG. 4E.

Figure 3F:
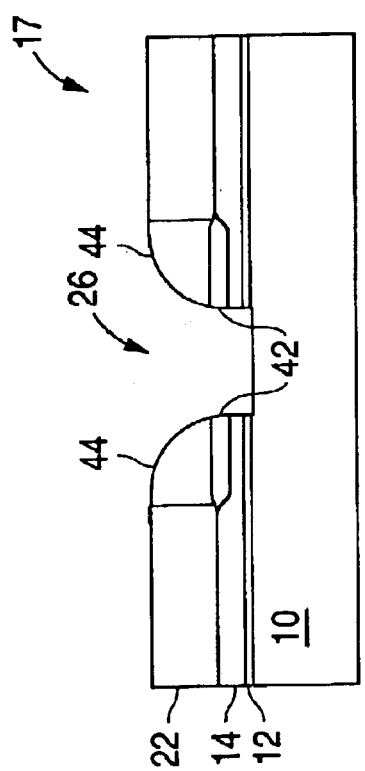
Figure 4F:
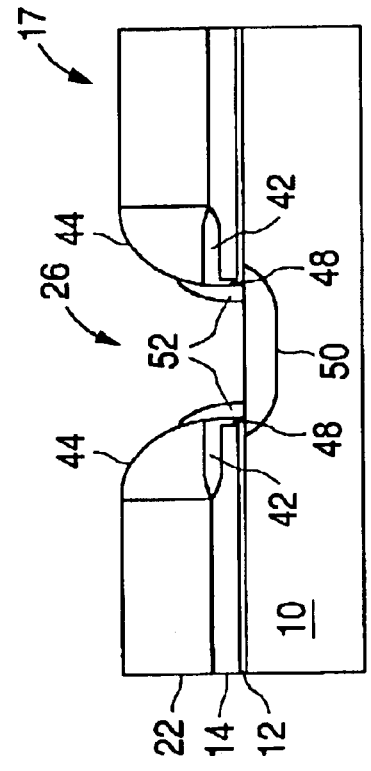

An oxidation step is then performed, where in the active regions 17, the sides of polysilicon layer 14 and the substrate surface that are exposed inside trenches 26 are oxidized to form oxide side walls 48 on the sides of poly layer 14 and to reform oxide layer 12 over the substrate 10 exposed inside trenches 26. Suitable ion implantation is then made across the entire surface of the structure. Where the ions have sufficient energy to penetrate the oxide layer 12 in trenches 26, they then form first regions (i.e. source regions) 50 in the substrate 10. In all other regions, the ions are absorbed by the existing structure, where they have no effect. Insulation (e.g. oxide) spacers 52 are then formed inside trenches 26 by depositing a layer of oxide, followed by an anisotropic oxide etch, which removes the deposited oxide except for spacers 52. This oxide etch step also removes the center portion of oxide layer 12 from each of the trenches 30 to re-expose the substrate 10. The resulting active region structure is shown in FIG. 3F. The above described oxidation, ion implantation, and oxide deposition/etch steps have no appreciable net affect on the strap region structure 24, as shown in FIG. 4F.

Figure 4G:
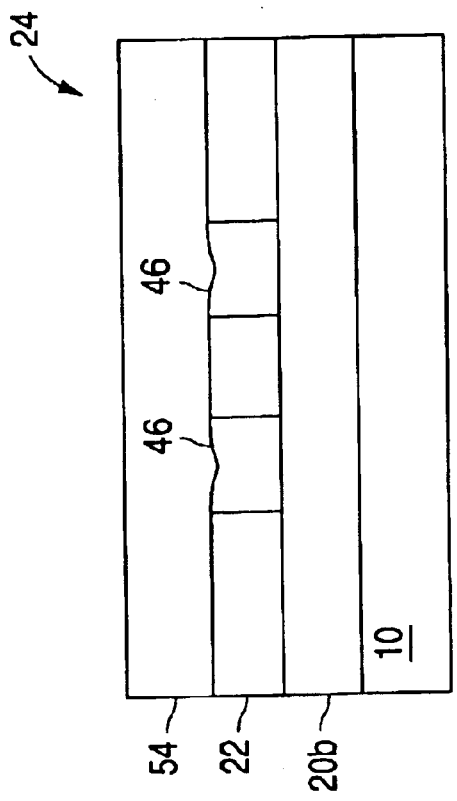
Figure 4H:
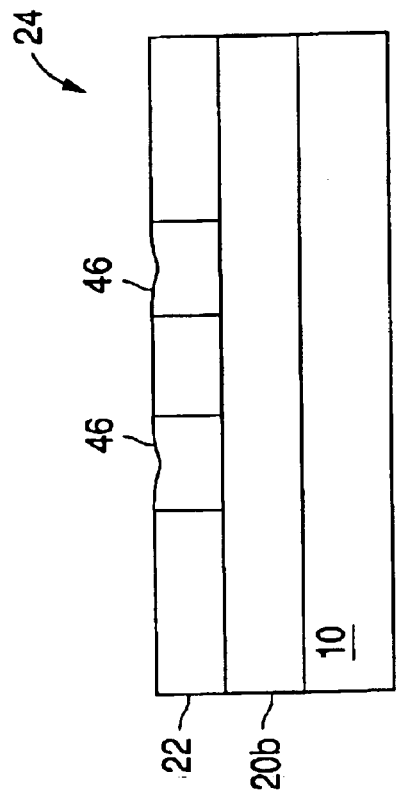
Figure 3G:
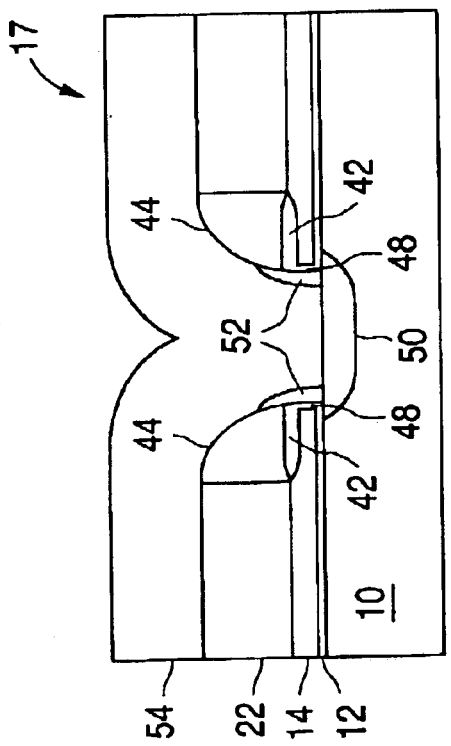
Figure 3H:
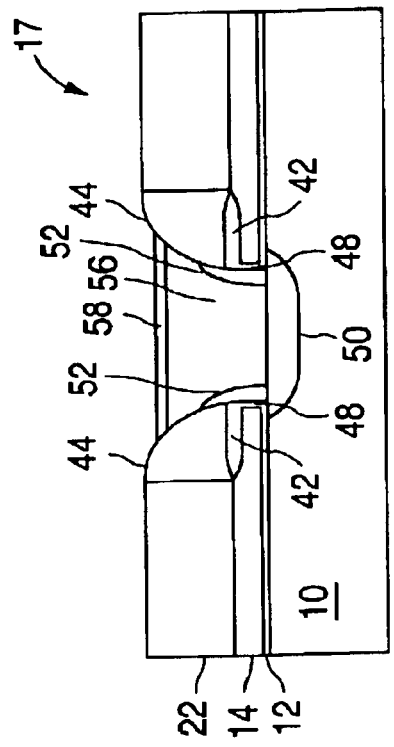

A poly deposition step is then performed, leaving a thick layer 54 of polysilicon over the active regions 17 and strap regions 24, as shown in FIGS. 3G and 4G, respectively. A poly planarization step follows (preferably CMP), which etches the poly layer 54 down to nitride layer 22, leaving poly blocks 56 in trenches 26 (in the active regions 17). A poly etch-back step follows to recess the top portion of poly blocks 56 below the tops of trenches 26, to remove any excess polysilicon outside of trenches 26 (and any polysilicon remaining in the strap regions 24). The polysilicon is properly doped either through an in-situ method or by conventional implantation. An oxide layer 58 is then formed by oxidizing the top portions of poly blocks 56, which has no affect on strap regions 24. The resulting active region structure is shown in FIG. 3H, and the resulting strap region structure is shown in FIG. 4H.

Figure 3I:
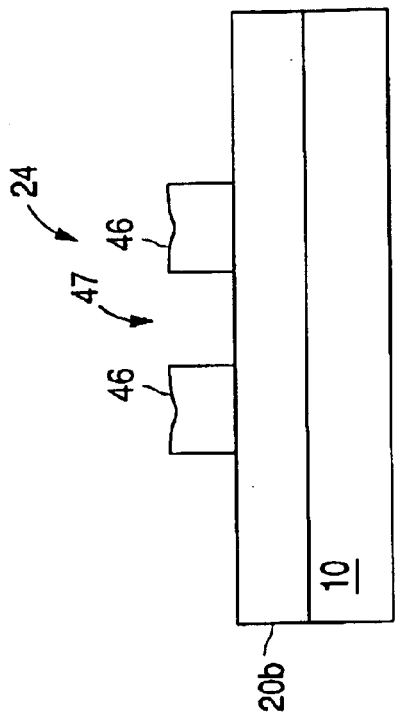
Figure 4I:
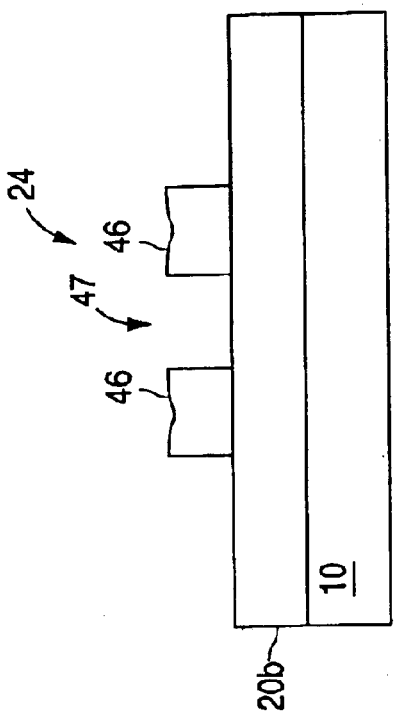
Figure 3J:
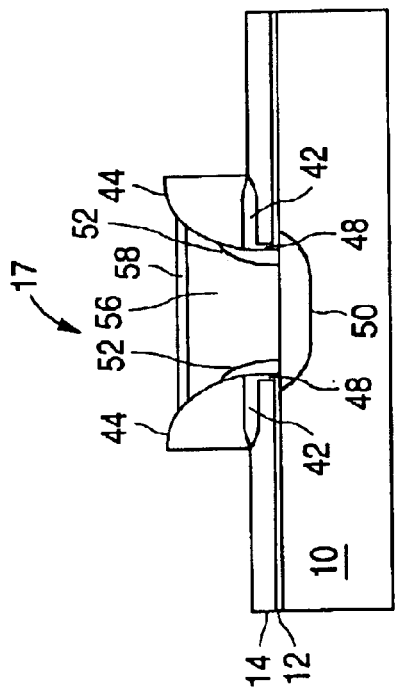
Figure 4J:
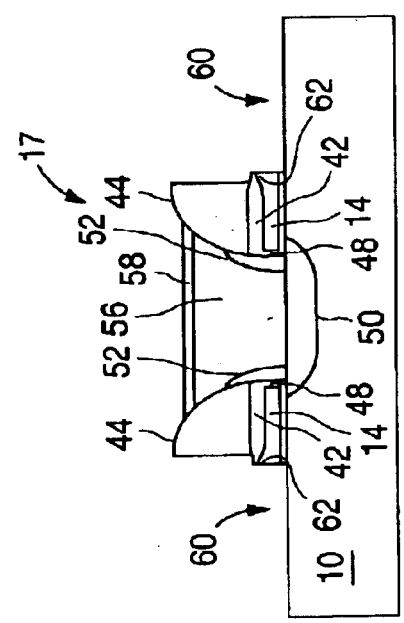

A nitride etch is then performed to remove nitride layer 22 from both the active regions 17 and the strap regions 24, as shown in FIGS. 3I and 4I. An anisotropic poly etch follows to remove the portion of poly layer 14 not covered by oxide spacers 44 and oxide layer 58 in the active regions 17 (FIG. 3J). The poly etch has no affect on the strap regions 24 (FIG. 4J). The nitride and poly etch steps effectively create second trenches 60, one on either side of the mirror pair of memory cells in the active regions 17, as well as upwardly projecting sharp edges 62 on side edges of poly layer 14. A controlled isotropic oxide etch is then performed, to remove exposed portions of oxide layer 12, and to remove a small portion of spacers 44 directly over the sharp edges 62. This oxide etch has a negligible effect on the strap regions 24. The resulting structures are shown in FIGS. 3J and 4J.

Figure 4K:
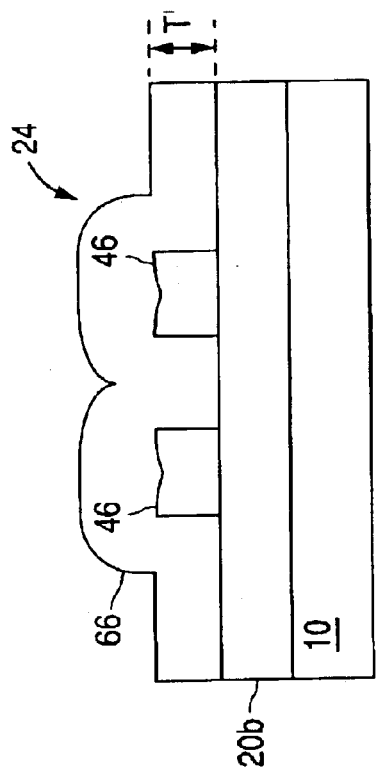
Figure 3K:
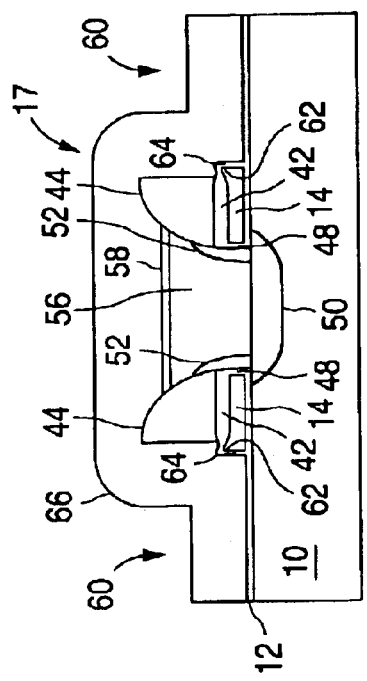

The next step is an oxidation process, which forms an oxide layer on the exposed ends 64 of poly layer 14 (strap regions 24 unaffected). Oxide layer 64 joins with oxide layer 42 in forming an insulation layer that is disposed adjacent to and over the polysilicon layer 14. The sharp edges 62 and the thickness of the insulation layer formed by oxide layers 64/42, permit Fowler-Nordheim tunneling of charges therethrough. The oxidation process also re-forms oxide layer 12 over the exposed portions of the substrate 10. The deposition of a thick poly layer 66 over the active region and strap region structures follows, as illustrated in FIGS. 3K and 4K.

Figure 4L:
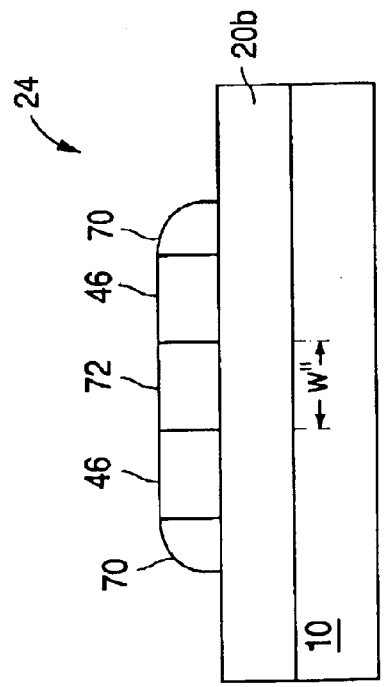
Figure 3L:
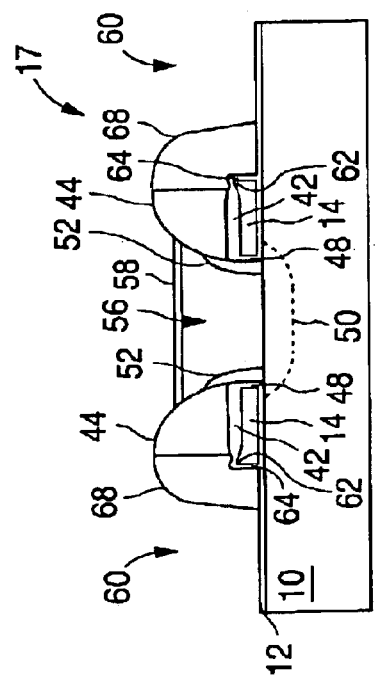

A dry poly etch process is then applied to the active and strap region structures. In the active regions 17, the poly etch removes poly layer 66 except for poly spacers 68 next to oxide spacers 44, as shown in FIG. 3L. In the strap regions 24, the poly etch removes poly layer 66 except for poly spacers 70 next to oxide blocks 46, and poly block 72 between oxide blocks 46, as shown in FIG. 4L. The width W" between the oxide blocks 46 needs to be small enough compared to the thickness of the deposited polysilicon 66 so that poly block 72 fills the space between oxide blocks 46 and has a planar upper surface. Specifically, width W" should be no greater than approximately twice the thickness T' of the deposited polysilicon, as shown in FIGS. 4K and 4L.

Nitride is deposited over the active and strap region structures, followed by an anisotropic nitride etch (such as RIE dry etch) to remove all the added nitride except for spacers 74 adjacent poly spacers 68 in the active regions 24 (FIG. 3M), and for spacers 76 adjacent poly spacers 70 in the strap regions 24 (FIG. 4M). Ion implantation (e.g. N+) is then used to form second regions (i.e. drain regions) 78 in the active region substrate in the same manner as the first regions 50 were formed. The ion implantation has no effect on the strap regions 24.

A thin oxide etch is performed to remove any exposed portions of thin oxide layer 12 over substrate 10 in the active regions 17 (no appreciable effect in strap regions 24). A metal deposition step is then performed, to deposit a metal such as tungsten, cobalt, titanium, nickel, platinum, or molybdenum over the active and strap region structures. The structures are then annealed, permitting the hot metal to flow and to seep into the exposed top portions of the substrate 10 to form a conductive layer of metalized silicon 80 (suicide) on the substrate next side wall spacers 74. Metalized silicon region 80 on substrate 10 can be called self aligned silicide (i.e. salicide), because it is self aligned to the second regions 78 by spacers 74. The hot metal also forms a conductive layer of metalized polysilicon 82 (polycide) on the exposed top portions of poly spacers 68 (active regions 17), poly spacers 70 (strap regions 24) and poly blocks 72 (strap regions 24). The remaining metal deposited on the remaining structure is removed by a metal etch process.

Passivation, such as BPSG 84, is used to cover the active and strap region structures. A masking step is performed to define etching areas over the second regions 78 (active regions) and the poly blocks 72 (strap regions). The BPSG 84 is selectively etched in the etching areas to create contact openings that are ideally centered over the second regions 78 and poly blocks 72. The contact openings are then filled with conductor metal contacts 86 and 102 by metal deposition and planarizing etch-back. The salicide and polycide layers 80/82 enhance conduction between the conductors 86/102 and the second regions 78 or poly blocks 72. In the active regions, a bit line 88 is added by metal masking over the BPSG 84 to connect together all the contacts 86 in each of the active regions. In the strap regions, strap jumpers 90 are added by metal masking over the BPSG 84 to connect to contacts 102.

A metal source line strap 112 and a pair of metal word line straps 114 and 116 are formed over, and extend parallel to, each row of memory cells preferably by a similar metal masking process used to form bit lines 88. In the strap regions, a metal via 118 is formed to connect the strap jumper 90 with the appropriate strap 112/114/116. The metal via 90 shown in FIG. 4M connects the strap jumper 90 with the word line strap 116. Metal straps 112/114/116, jumpers 90 and metal via's 118 are surrounded by an appropriate insulation material 120, such as oxide. The final active region memory cell structure is illustrated in FIG. 3M, and the final strap region structure is illustrated in FIG. 4M.

As shown in FIG. 3M, first and second regions 50/78 form the source and drain for each cell (those skilled in the art know that source and drain can be switched during operation). The channel region 92 for each cell is the portion of the substrate that is in-between the source and drain 50/78. Poly spacers 68 constitute the control gates, and poly layer 14 constitutes the floating gate. The control gates 68 have a lower first portion 94 that is disposed adjacent the floating gate 14 (insulated therefrom by oxide layer 64), and an upper second portion 96 that protrudes over the sharp edge 62 of floating gate 14. Floating gate 14 is disposed over part of the channel region 92, is partially overlapped at one end by the control gate 68, and partially overlaps the first region 50 with its other end. FIG. 3M shows that the process of the present invention forms pairs of memory cells that mirror each other, where each pair of memory cells shares a single source region 50.

Figure 6A:
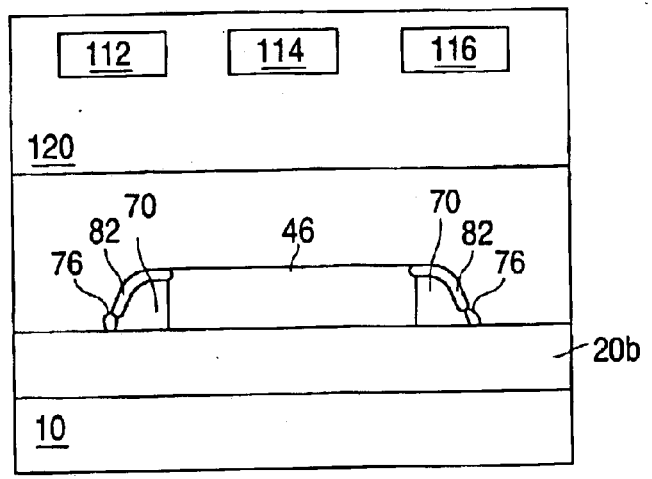
FIG. 6A is a cross sectional view of the completed strap region structure imaged by the line 6A—6A portion of the mask of FIG. 5.
Figure 6B:
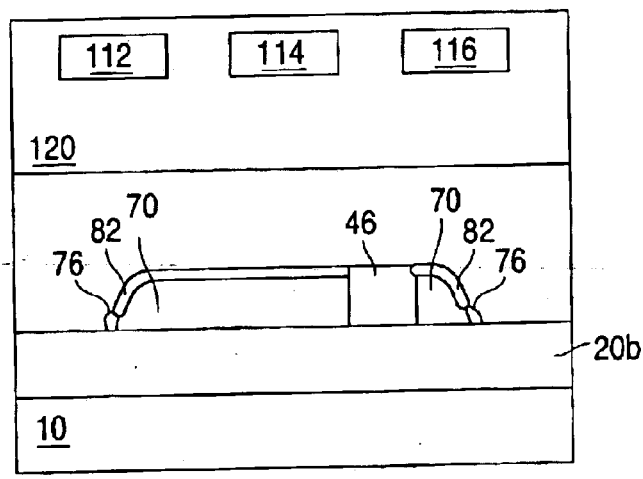
FIG. 6B is a cross sectional view of the completed strap region structure imaged by the line 6B—6B portion of the mask of FIG. 5.
Figure 6C:
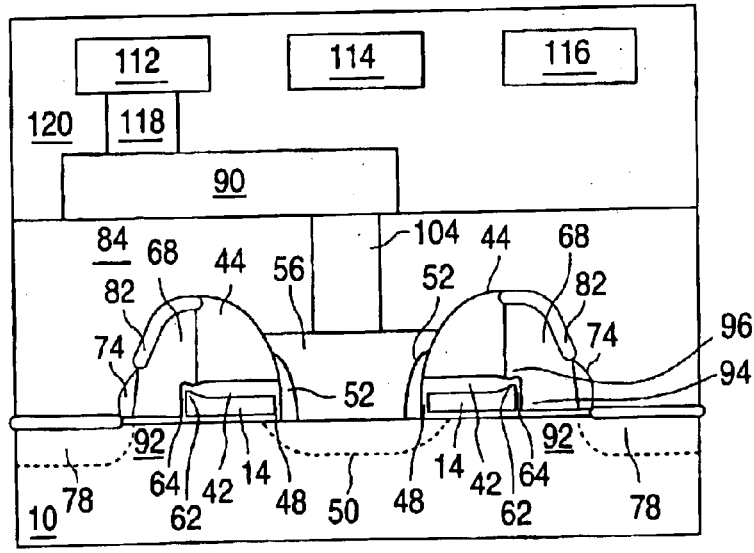
FIG. 6C is a cross sectional view of the completed strap region structure along the line 6C—6C of FIG. 7.
Figure 7:
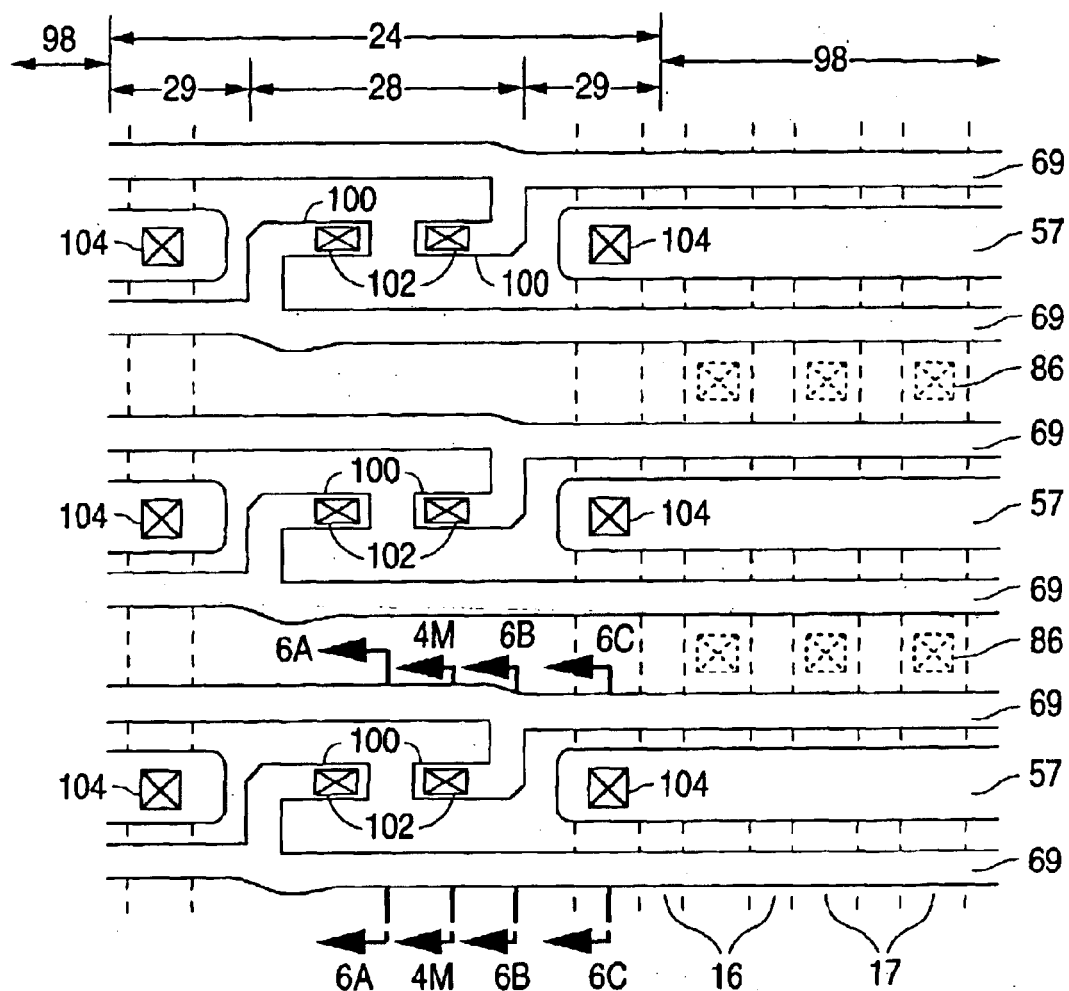
FIG. 7 is a top plan view of the strap cells and adjacent memory cell arrays of the present invention.

FIG. 4M is the final cross sectional view of one portion of the 'H' shaped trench pattern formed strap region 24 (corresponding to line 4B—4B of the mask 30 in FIG. 5). FIGS. 6A, 6B and 6C illustrate cross sections of other portions of the trench pattern formed in strap regions 24, corresponding to lines 6A—6A, 6B—6B and 6C—6C, respectively, of mask 30 in FIG. 5, and as shown in FIG. 7. These figures illustrate, given the proper dimensions of mask 30, that conductive polysilicon is generally formed on those strap region portions imaged under the opaque portions of mask region 32, and silicon dioxide is generally formed on those strap region portions imaged under the transparent aperture portions of mask region 32.

Thus, the final layout of the structure is illustrated in FIG. 7. Columns of strap regions 24 are interlaced with columns of memory cell arrays 98, where the memory cell arrays 98 include columns of active regions 17 interlaced with columns of isolation regions 16. Each row in each strap region 24 includes a WL strap cell 28 disposed between a pair of SL strap cells 29, all aligned with one of the memory cell rows. The active regions 17 immediately adjacent to the WL strap cells 28 are actually dummy regions that do not contain any active memory cells, but rather are part of the strap region 24 and used to form the SL strap cells 29.

The control gates 68 for each row of memory cells are continuously formed as a single word line 69 that connects together all the control gates 68 in that row of memory cells. Each of the word lines 69 pass through the strap regions 24. An 'L' shaped contact lead 100 (corresponding to one of the 'L' shaped members 35 of mask 30) extends from each of the word lines 69 toward the center of the WL strap cell 28, and terminates with the electrical contact 102 formed thereon. Each of the word line straps 114/116 extend parallel to one of the word lines 69, with intermittent electrical contact therebetween in the strap regions 24 by metal contacts 102, metal jumpers 90 and metal via's 118. The metal word line straps 114/116 ensure that an even voltage is applied along the entire length of each of the word lines 69.

The poly blocks 56 (disposed over source regions 50) for each row of memory cells pairs are continuously formed as a single source line 57 that connects together all the poly blocks 56 (and source regions 50 connected thereto) in that row of memory cell pairs. Each of the source lines 57 terminate in the SL strap cells 29, and do not pass through the strap regions 24. Instead, each source line 57 terminates with an electrical contact 104 formed near the center of the SL strap cell 29 in a similar manner as the bit line contacts 86, as shown in FIG. 7. The metal source line straps 112 connect together the contacts 104 in the strap cells 29 through metal via 118 and metal strap jumper 90. In the preferred embodiment, the metal source line straps 112 each extend parallel to source lines 57, with contact to the underlying source line 57 by contacts 104 in strap cells 29. Alternately, source line straps 112 could simply extend from one SL strap cell 29, over or around the WL strap cell 28, to the other SL strap cell 29 in the same strap region 24. In any event, word line straps 114/116, source line straps 112, and bit lines 88 are all metal conduit that are three-dimensionally configured (lateral spacing and height above the memory cell array) in and above the BPSG so as to not interfere with each other, yet each connect between with the appropriate voltage source and strap regions with minimal space requirements.

Figure 8:
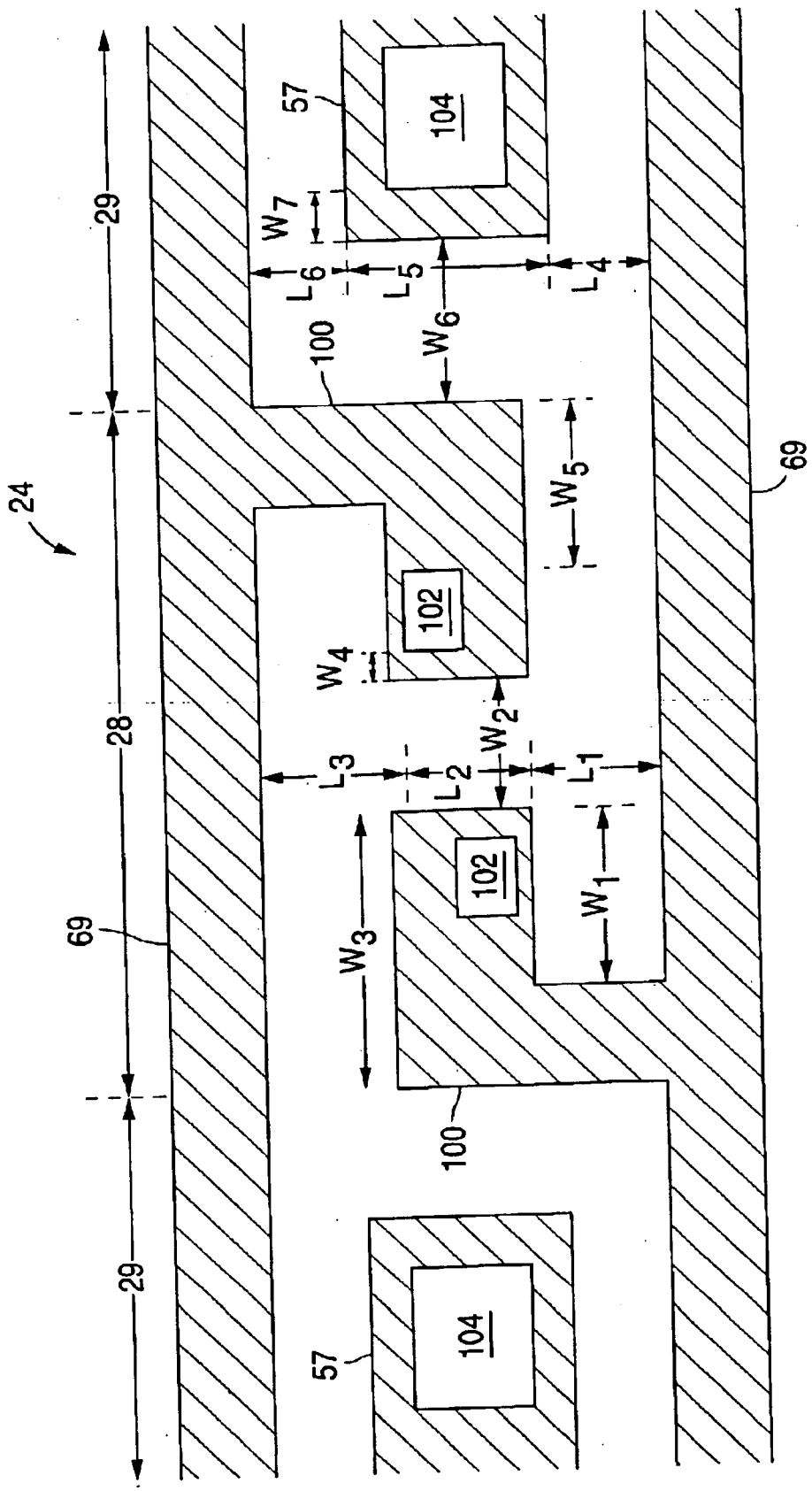
FIG. 8 is a top plan view of a WL strap cell and SL strap cell structure of the strap region of the present invention.

FIG. 8 illustrates various dimensions of the strap region 24 that can be optimized to best form electrical contacts 102 and 104 without shorting the word lines 69 to each other, or to the source line 57. W1 to W7 (and L1 to L6) are ideally set so any inadvertent horizontal (and/or vertical) shifts of any of the strap region elements would not result in an improperly formed contact or an inadvertent short. However, certain dimensions must be small enough to prevent the formation of the source line 57 in the strap region 24. For example, for many applications, the dimensions between conductive elements (e.g. L1, L3, W2) should be no greater than approximately twice the thickness T of the insulation layer deposited to form the insulation therebetween. Thus, the deposited insulation is not removed by subsequent etch steps to prevent the formation of conductive material in these regions.

Figure 1:
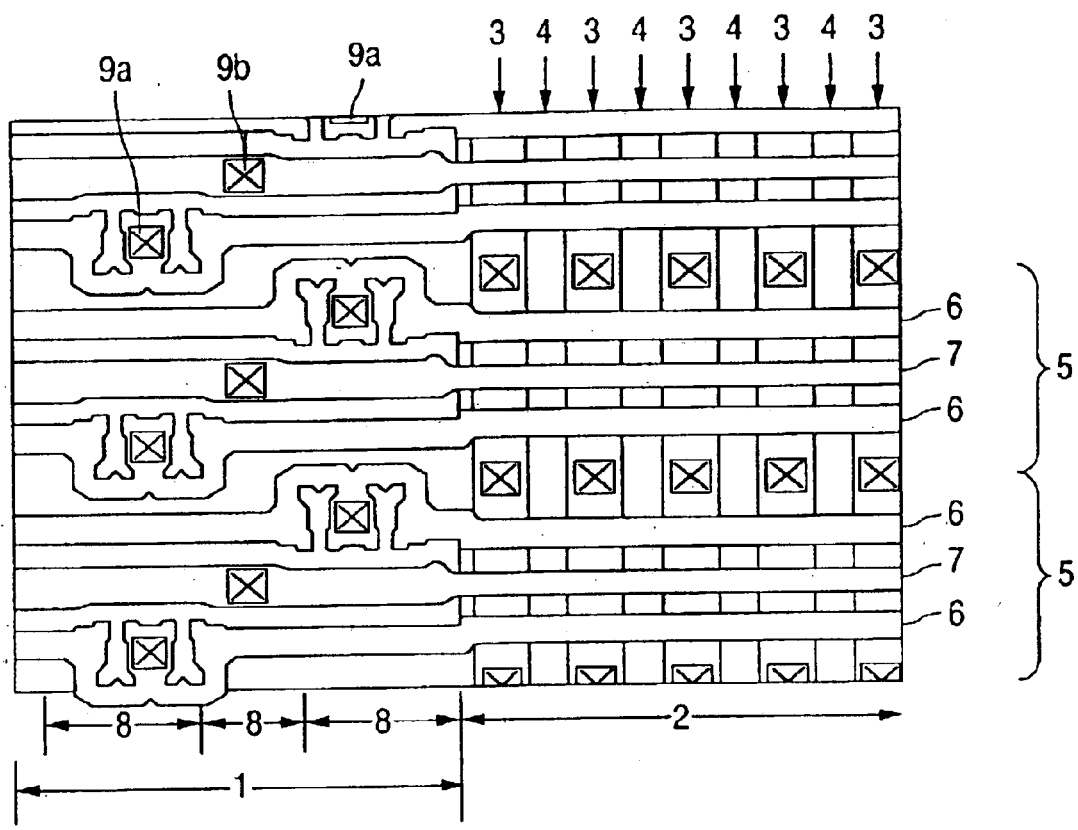
FIG. 1 is a top view of an array of non volatile memory cells, and a conventional strap region formed adjacent thereto.

With the present invention, additional room is made within the strap regions 24 because the source lines 57 do not traverse therethrough. This additional room allows the strap cells 28 and contacts formed therewith to be formed within the "effective width" of the memory cell row, and even along the row centerlines, as opposed to extending out toward adjacent memory cell rows as shown in FIG. 1. The "effective width" of a memory cell row is the distance (in the Y direction) taken up by the conductive memory cell components (e.g. floating gate, source line, control gate or control line, etc.) formed above the substrate. Thus, for the mirror cells illustrated in the figures, the "effective width" of each row is the distance between the two word lines 69 in each row of memory cells (distances $L_4$, $L_5$ and $L_6$) plus the widths of the two word lines 69 themselves. This is important because the word line electrical contacts 9a in FIG. 1 had to be formed outside of the effective width of the corresponding row of memory cells. As a result, the scaling down of the memory cell array along the "Y" direction was consequently prohibited because extra (wasted) space between memory cell rows was necessary to leave room for these electrical contacts. The present invention removes this constraint by allowing strap cells 28 to be formed within the effective width of the memory cell row, and in some embodiments even within the distance between pairs of word lines in each row, to form rows of memory cells in the array that are closer together (in the Y direction). Further, for any given size strap cell region 24, the extra room allows contacts 102 to be formed further apart to reduce the risk of shorting word or source lines together. Finally, the extra room within the strap regions 24 allows them, and the memory cell array as whole, to be safely scaled down in size in both the X (row) and Y (column) directions.

It should be noted that by following the same concepts as demonstration above, other configurations of mask 30 can be used to form strap regions 24 according to the present invention. For example, FIGS. 9A, 10A, 11A and 12A are alternate embodiments of mask 30, where the patterned aperture 31 resembles an 'S' shape (FIG. 9A), a '$' shape (FIG. 10A), an 'I' shape (FIG. 11A), or a modified 'S' shape (FIG. 12A).

Figure 9A:
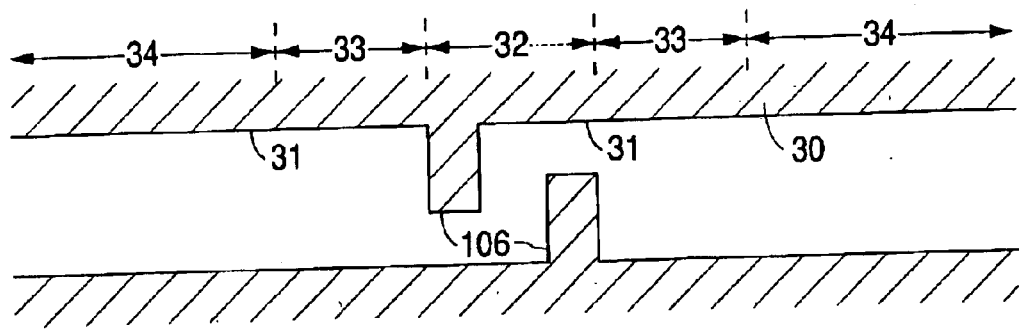
FIG. 9A is a top view of a first alternate embodiment of the mask, which is used to form the first trenches in the active regions and the 'S' shaped strap cell in the strap regions.
Figure 9B:
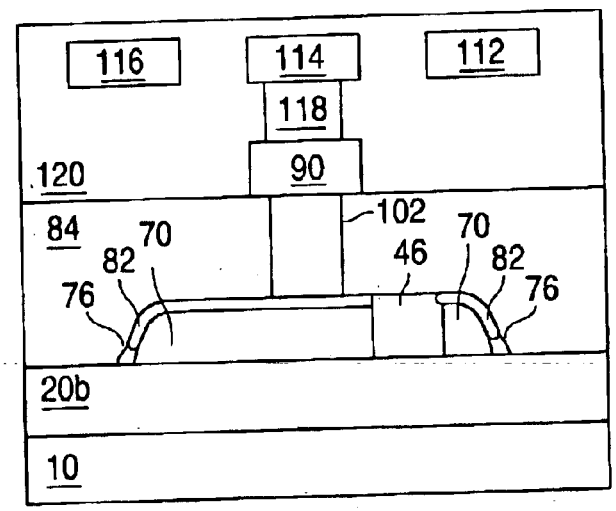
FIG. 9B is a cross sectional view of the 'S' shaped strap region structure along line 9B—9B in FIG. 9C.
Figure 9C:
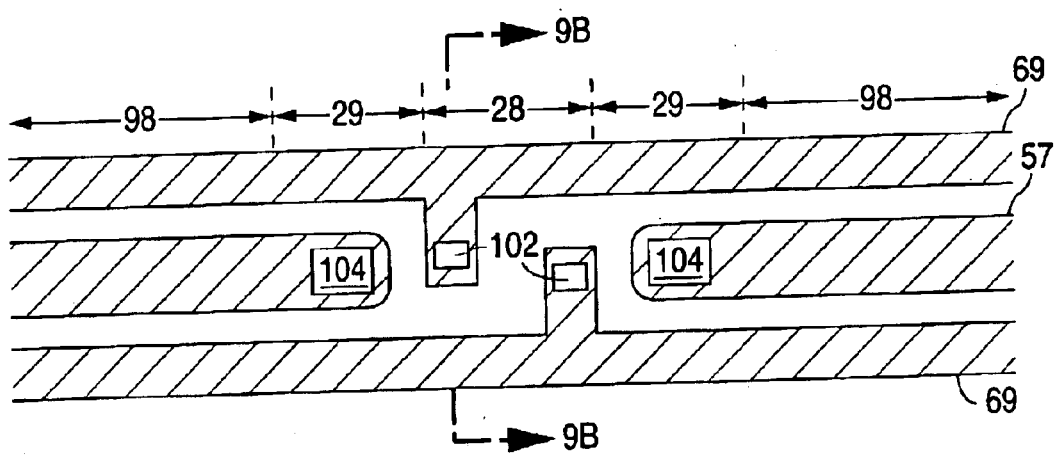
FIG. 9C is a top view of the 'S' shaped strap cell structure.

The 'S' shaped mask 30 of FIG. 9A includes a pair of tab members 106 that extend out from opposing sides of aperture 31 to form an 'S' shaped aperture. The cross-section of the resulting structure imaged under the tab members 106 is illustrated in FIG. 9B, and the resulting layout of the final structure is illustrated in FIG. 9C.

Figure 10A:
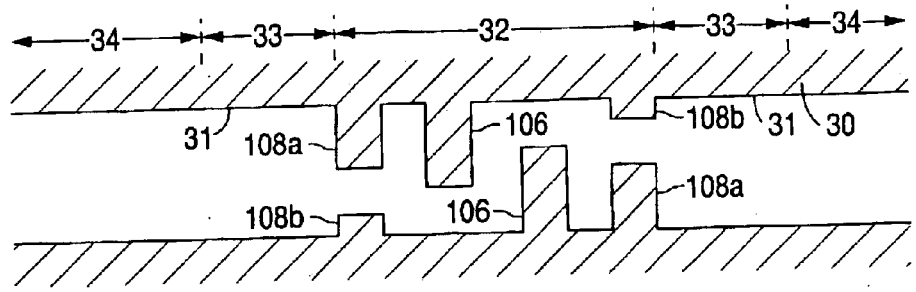
FIG. 10A is a top view of a second alternate embodiment of the mask, which is used to form the first trenches in the active regions and the '$' shaped strap cell in the strap regions.
Figure 10B:
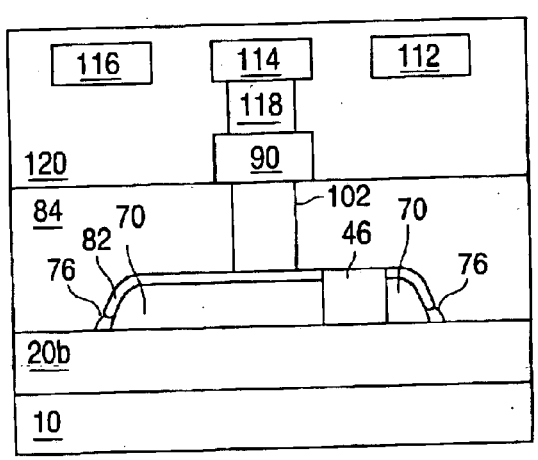
FIGS. 10B and 10C are cross sectional views of the '$' shaped strap region structure, along lines 10B—10B and 10C—10C respectively in FIG. 10D.
Figure 10C:
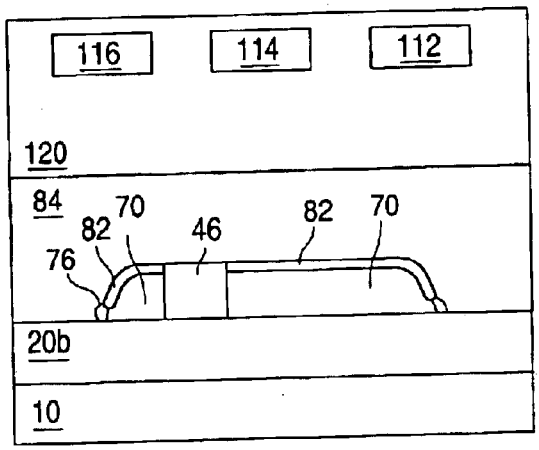
Figure 10D:
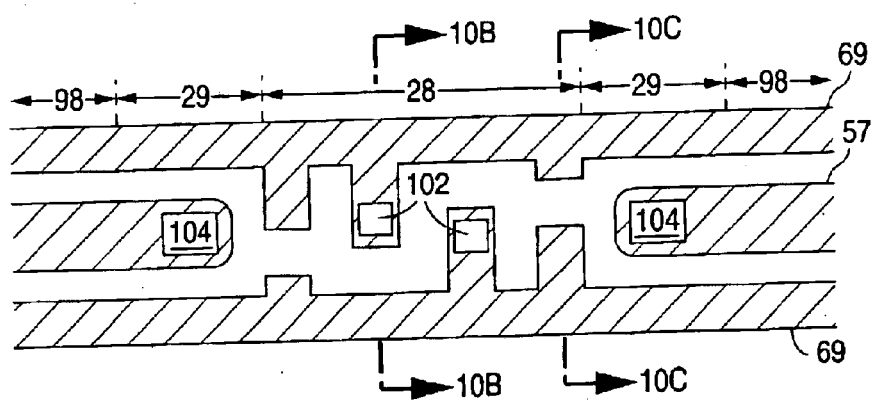
FIG. 10D is a top view of the '$' shaped strap cell structure.

The '$' shaped mask 30 of FIG. 10A is similar to that shown in FIG. 9A, but further includes opposing tab members 108a and 108b that extend out from opposing sides of aperture 31 to form a '$' shaped aperture 31. The cross-sections of the resulting structure imaged under the tab members 106 and under tab members 108a/b are illustrated in FIGS. 10B and 10C respectively, and the resulting layout of the final structure is illustrated in FIG. 10D.

Figure 11A:
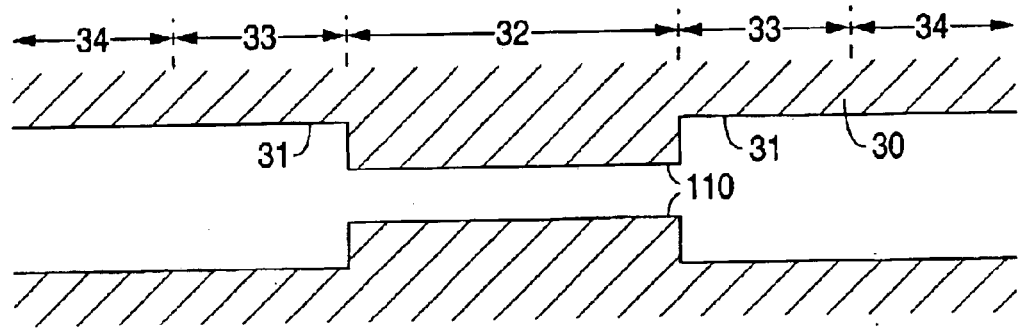
FIG. 11A is a top view of a third alternate embodiment of the mask, which is used to form the first trenches in the active regions and the 'I' shaped strap cell in the strap regions.
Figure 11B:
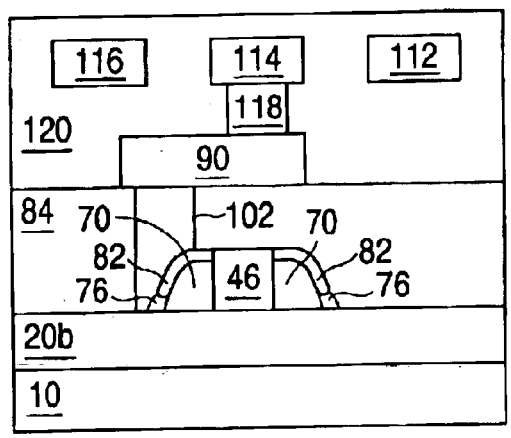
FIG. 11B is a cross sectional view of the 'I' shaped strap region structure, along line 11B—11B in FIG. 11C.
Figure 11C:
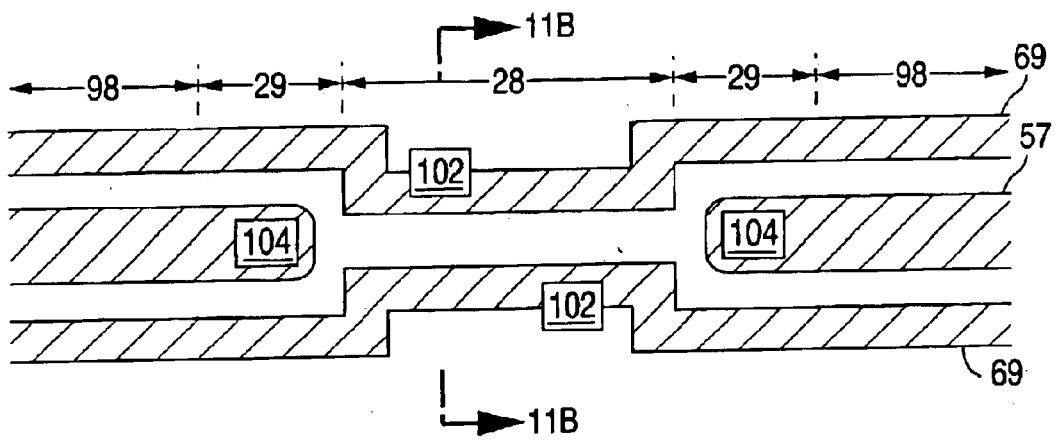
FIG. 11C is a top view of the 'I' shaped strap cell structure.
Figure 12A:
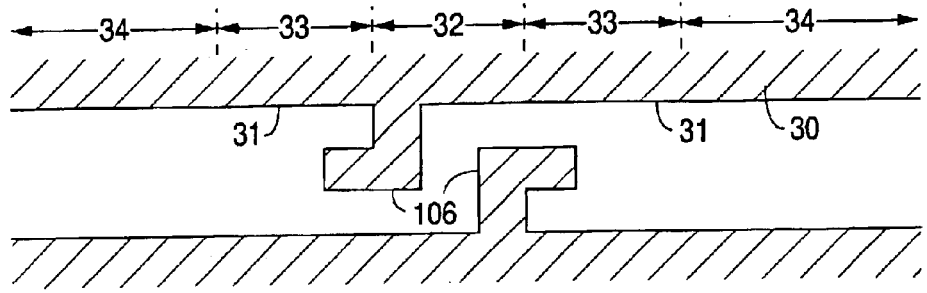
FIG. 12A is a top view of a fourth alternate embodiment of the mask, which is used to form the first trenches in the active regions and the 'S' shaped strap cell in the strap regions.

The 'I' shaped mask 30 of FIG. 11A includes a pair of directly opposing tab members 110 that extend out from opposing sides of aperture 31 to form an 'I' shaped aperture 31. The cross-section of the resulting structure imaged under the tab members 110 is illustrated in FIG. 11B, and the resulting layout of the final structure is illustrated in FIG. 11C.

Figure 12B:
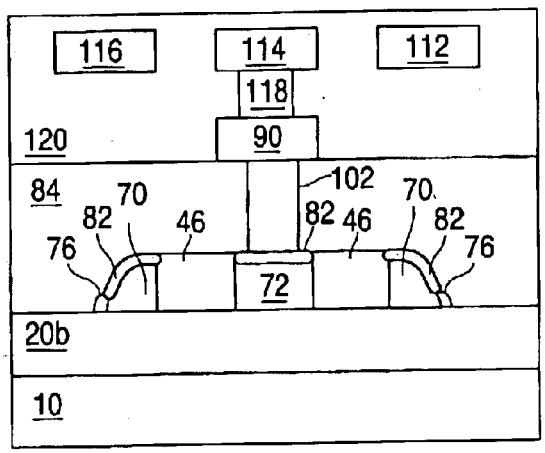
FIG. 12B is a cross sectional view of the 'S' shaped strap region structure, along line 12B—12B in FIG. 12C.
Figure 12C:
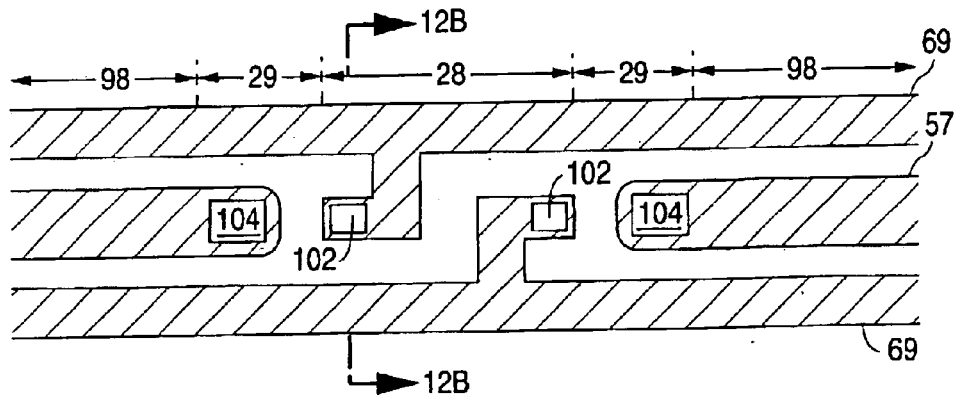
FIG. 12C is a top view of the 'S' shaped strap cell structure.

The modified 'S' shaped mask 30 of FIG. 12A includes a pair of 'L' shaped tab members 106 that are similar to the 'L' shaped tabs 35 shown in FIG. 5. The tabs 106 extend out from opposing sides of aperture 31, and then extend away from each other, to form an 'S' shaped aperture. The cross-section of the resulting structure imaged under the tab members 106 is illustrated in FIG. 12B, and the resulting layout of the final structure is illustrated in FIG. 12C.

Each of the masks shown in FIGS. 9A, 10A, 11A or 12A result in a strap region 24 which is not traversed by the source line 57, and provides locations for forming the word line and source line contacts 102/104 that are sufficiently spaced apart from each other and from other strap region elements.

It is to be understood that the present invention is not limited to the embodiments described above and illustrated herein, but encompasses any and all variations falling within the scope of the appended claims. For example, although the foregoing method describes the use of appropriately doped polysilicon as the conductive material used to form the memory cells and conductive word/source lines, it should be clear to those having ordinary skill in the art that any appropriate conductive material can be used. Therefore, as used in the claims, the term "conductive material" encompasses all such conductive materials (e.g. polysilicon, polysilicide, salicide, etc). In addition, any appropriate insulator can be used in place of silicon dioxide or silicon nitride. Moreover, any appropriate material whose etch property differs from silicon dioxide (or any insulator) and from polysilicon (or any conductor) can be used in place of silicon nitride. Further, as is apparent from the claims, not all method steps need be performed in the exact order illustrated or presented in the claims, but rather in any order that allows the proper formation of the memory cell of the present invention. Moreover, the masks shown and described herein are used in a positive masking step processes, where the material under the photo resist exposed to light via the patterned mask aperture 31 is eventually removed. However, negative photo resist processes are known and usable with the present invention, where the material under the photo resist not exposed to light via the patterned mask aperture is eventually removed. With such negative photo resist processes, the masks are reversed, where the opaque mask material replaces the transparent apertures, and vice versa. The word and source lines need not have a continuous width or shape, need not be straight, and need not be formed as spacers, but rather can have any size and shape that effectively connects to each memory cell or memory cell pair in the appropriate memory cell row. Source and drain regions, and/or source and bit lines, can be swapped. Finally, the strap cell method and design of the present invention is applicable to any type or design of memory cell array having lines of polysilicon extending along and connected to rows or columns of memory cells.

What is claimed is:

1. A method of forming an array of memory devices, the method comprising the steps of:

forming an array of memory cells on a semiconductor substrate having a first conductivity type;

forming a first plurality of parallel spaced apart lines of conductive material over the substrate that are electrically coupled to the memory cells;

forming a second plurality of parallel spaced apart lines of conductive material over the substrate and electrically connected to the memory cells; and forming a strap region on the substrate and adjacent to the memory cell array, the formation of the strap region including the steps of:

forming first strap cells in the strap region through which the first plurality of conductive material lines traverse, wherein the first plurality of conductive material lines completely traverse across the strap region, forming a first plurality of conductive metal contacts each of which is connected to one of the first plurality of conductive material lines in one of the first strap cells, forming second strap cells in the strap region in which the second plurality of conductive material lines terminate without completely traversing across the strap region, and forming a second plurality of conductive metal contacts each of which is connected to one of the second plurality of conductive material lines in one of the second strap cells.

2. The method of claim 1, wherein the formation of the first strap cells includes the steps of:

forming a layer of first material over the substrate in the strap region;

etching a trench pattern into the layer of first material;
filling the etched trench pattern with a second material;
removing the first material from the strap region; and
forming a layer of conductive material over the substrate and adjacent to the second material, wherein the conductive material forms portions of the first plurality of conductive material lines that traverse across the strap region.

3. The method of claim 2, wherein the filling of the etched trench pattern with the second material includes the steps of:
depositing the second material over the first material and in the etched trench pattern; and
etching the second material disposed over the first material, leaving the second material disposed in the trench pattern.

4. The method of claim 3, wherein a width dimension of the trench pattern is sufficiently small relative to a thickness of the deposited second material so that the etching of the second material removes the second material over the first material without removing the second material disposed in the trench pattern.

5. The method of claim 2, wherein the trench pattern has a width that is no greater than approximately twice the thickness of the deposited second material.

6. The method of claim 2, wherein the etching of the trench pattern includes the steps of:
depositing layer of photo-resist material over the layer of first material;
imaging a patterned mask aperture onto the photo-resist material to define the trench pattern; and
removing the photo-resist material and the first material from the defined trench pattern.

7. The method of claim 6, wherein the patterned mask aperture is substantially H-shaped.

8. The method of claim 6, wherein the patterned mask aperture is substantially $-shaped.

9. The method of claim 6, wherein the patterned mask aperture is substantially I-shaped.

10. The method of claim 6, wherein the patterned mask aperture is substantially S-shaped.

11. The method of claim 1, wherein the formation of the array of memory cells includes the steps of:
forming a plurality of spaced apart isolation regions on the substrate which are substantially parallel to one another and extend in a first direction, with an active region between each pair of adjacent isolation regions, the active regions each comprising a first layer of insulation material on the semiconductor substrate and a first layer of conductive material on the first layer of insulation material;
forming a second layer of insulation material in each of the active regions that is disposed adjacent to and over the first layer of conductive material;
forming a plurality of spaced apart first trenches across the active regions and isolation regions which are substantially parallel to one another and extend in a second direction that is substantially perpendicular to the first direction and exposing the first layer of the conductive material in each of the active regions;
forming side wall spacers of a material on side walls of the first trenches;
forming second trenches in each of the active regions, wherein each of the second trenches has a side wall that is immediately adjacent to one of the side wall spacers;
removing a portion of the side wall spacers to form an indentation in each of the second trench side walls;
filling each of the second trenches with a second conductive material to form blocks of
the second conductive material, wherein for each of the blocks in each active region:
the block is adjacent to the second layer of insulation material and is insulated from the substrate, and
the block includes a protruding portion formed by the second french side wall indentation that is disposed over the second layer of insulation material and the first layer of conductive material; and
forming a plurality of first and second regions in the substrate having a conductivity type different from that of the substrate, wherein each of the second regions is spaced apart from the first regions.

12. The method of claim 11, wherein:
the formation of the first plurality of conductive material lines includes integrally forming the first plurality of conductive material lines with the blocks of second conductive material; and
the second plurality of conductive material lines are electrically connected to the first regions.

13. The method of claim 1, wherein the formation of the memory cell array includes forming rows of memory cells extending in a first direction, and wherein the formation of the strap region includes aligning each of the first and second strap cells with one of the rows of memory cells.

14. The method of claim 13, wherein each of the second strap cells is aligned and adjacent to an end of one of the rows of memory cells.

15. The method of claim 14, wherein each of the first strap cells is aligned and adjacent to one of the second strap cells.

16. The method of claim 13, wherein:
each row of the memory cell array includes pairs of memory cells;
each pair of the memory cells includes a common first region formed in the substrate and a pair of floating gates disposed over and insulated from the substrate, the first regions having a second conductivity type that is different from the first conductivity type; and
each of the second plurality of conductive material lines extends along one of the rows of the memory cell array and is electrically connected to the first regions of the one row of memory cells.

17. The method of claim 16, wherein for each of the rows of the memory cell array, a pair of the first plurality of conductive material lines extend along the row and include portions that form control gates in each of the memory cells that are disposed adjacent to and insulated from the floating gates.

18. The method of claim 17, wherein for each of the rows:
the first strap cells include contact leads extending from the pair of first plurality of conductive material lines traversing therethrough, and
each of the first plurality of conductive metal contacts is attached to one of the contact leads and is disposed between the pair of the first plurality of conductive material lines.

19. The method of claim 13, wherein:
the formation of the first strap cells includes forming contact leads extending from the first plurality of conductive material lines traversing therethrough, and
each of the first plurality of conductive metal contacts is attached to one of the contact leads and aligned to a center of one of the rows of memory cells.

20. The method of claim 13, wherein:
the first strap cells include contact leads extending from the first plurality of conductive material lines traversing therethrough, and
each of the first plurality of conductive metal contacts is attached to one of the contact leads and is disposed within an effective width of one of the rows of memory cells.

21. The method of claim 13, wherein:
each of the first plurality of conductive material lines extends in the first direction and continuously along a length of one of the memory cell rows; and
each of the second plurality of conductive material lines extends in the first direction.

22. The method of claim 21, further comprising the steps of:
forming a first plurality of metal conduit each of which extending in the first direction and along a length of one of the first plurality of conductive material lines and electrically connected thereto by at least one of the first plurality of conductive metal contacts; and
forming a second plurality of metal conduit each of which extending in the first direction and electrically connected to one of the second plurality of conductive material lines by at least one of the second plurality of conductive metal contacts.

23. The method of claim 1, wherein the formation of the first strap cells includes forming contact leads extending from the first plurality of conductive material lines traversing therethrough, and wherein the first plurality of conductive metal contacts are attached to the contact leads.

24. The method of claim 23, wherein the contact leads are L-shaped.

25. The method of claim 23, wherein the contact leads are linearly shaped.

26. A method of forming an array of memory devices, the method comprising the steps of:
forming an array of memory cells on a semiconductor substrate having a first conductivity type;
forming a first plurality of parallel spaced apart lines of conductive material over the substrate that are electrically coupled to the memory cells;
forming a second plurality of parallel spaced apart lines of conductive material over the substrate and electrically connected to the memory cells; and
forming a plurality of strap regions on the substrate in an interlaced fashion between adjacent portions of the memory cell array, the formation of each of the strap regions including the steps of:
forming first strap cells in the strap region through which the first plurality of conductive material lines traverse, wherein the first plurality of conductive material lines completely traverse across the strap regions,
forming a first plurality of conductive metal contacts each of which is connected to one of the first plurality of conductive material lines in one of the first strap cells,
forming second strap cells in the strap region in which the second plurality of conductive material lines terminate without completely traversing across the strap region, and
forming a second plurality of conductive metal contacts each of which is connected to one of the second plurality of conductive material lines in one of the second strap cells.

27. The method of claim 26, wherein each of the first plurality of conductive material lines continuously traverses the memory cell array portions and the strap regions.

28. The method of claim 27, wherein each of the second plurality of conductive material lines continuously traverses one of the memory cell array portions without completely traversing any of the strap regions.

29. The method of claim 26, wherein the formation of the first strap cells includes the steps of:
forming a layer of first material over the substrate in the strap regions;
etching trench patterns into the layer of first material;
filling the etched trench patterns with a second material;
removing the first material from the strap regions; and
forming a layer of conductive material over the substrate and adjacent to the second material, wherein the conductive material forms portions of the first plurality of conductive material lines that traverse across the strap regions.

30. The method of claim 29, wherein the filling of the etched trench patterns with the second material includes the steps of:
depositing the second material over the first material and in the etched trench patterns; and
etching the second material disposed over the first material, leaving the second material disposed in the trench patterns.

31. The method of claim 30, wherein a width dimension of the trench pattern is sufficiently small relative to a thickness of the deposited second material so that the etching of the second material removes the second material over the first material without removing the second material disposed in the trench patterns.

32. The method of claim 31, wherein each of the trench patterns has a width that is no greater than approximately twice the thickness of the deposited second material.

33. The method of claim 29, wherein the etching of the trench patterns includes the steps of:
depositing layer of photo-resist material over the layer of first material;
imaging patterned mask apertures onto the photo-resist material to define the trench patterns; and
removing the photo-resist material and the first material from the defined trench patterns.

34. The method of claim 33, wherein the patterned mask apertures are substantially H-shaped.

35. The method of claim 33, wherein the patterned mask apertures are substantially $-shaped.

36. The method of claim 33, wherein the patterned mask apertures are substantially I-shaped.

37. The method of claim 33, wherein the patterned mask apertures are substantially S-shaped.

38. The method of claim 26, wherein the formation of the array of memory cells includes the steps of:
forming a plurality of spaced apart isolation regions on the substrate which are substantially parallel to one another and extend in a first direction, with an active region between each pair of adjacent isolation regions, the active regions each comprising a first layer of insulation material on the semiconductor substrate and a first layer of conductive material on the first layer of insulation material;
forming a second layer of insulation material in each of the active regions that is disposed adjacent to and over the first layer of conductive material;

forming a plurality of spaced apart first trenches across the active regions and isolation regions which are substantially parallel to one another and extend in a second direction that is substantially perpendicular to the first direction and exposing the first layer of the conductive material in each of the active regions;

forming side wall spacers of a material on side walls of the first trenches;

forming second trenches in each of the active regions, wherein each of the second trenches has a side wall that is immediately adjacent to one of the side wall spacers;

removing a portion of the side wall spacers to form an indentation in each of the second trench side walls;

filling each of the second trenches with a second conductive material to form blocks of the second conductive material, wherein for each of the blocks in each active region;

the block is adjacent to the second layer of insulation material and is insulated from the substrate, and the block includes a protruding portion formed by the second trench side wall indentation that is disposed over the second layer of insulation material and the first layer of conductive material; and forming a plurality of first and second regions in the substrate having a conductivity type different from that of the substrate, wherein each of the second regions is spaced apart from the first regions.

39. The method of claim 38, wherein:

the formation of the first plurality of conductive material lines includes integrally forming the first plurality of conductive material lines with the blocks of second conductive material; and the second plurality of conductive material lines are electrically connected to the first regions.

40. The method of claim 26, wherein the formation of the memory cell array includes forming rows of memory cells extending in a first direction, and wherein the formation of the strap regions includes aligning each of the first and second strap cells with one of the rows of memory cells.

41. The method of claim 40, wherein each of the second strap cells is aligned and adjacent to an end of one of the rows of memory cells.

42. The method of claim 41, wherein each of the first strap cells is aligned and adjacent to one of the second strap cells.

43. The method of claim 40, wherein:

each row of the memory cell array includes pairs of memory cells, each pair of the memory cells includes a common first region formed in the substrate and a pair of floating gates disposed over and insulated from the substrate, wherein the first regions have a second type of conductivity that is different from the first conductivity type; and each of the second plurality of conductive material lines extends along one of the rows of the memory cell array and is electrically connected to the first regions of the one row of memory cells.

44. The method of claim 43, wherein for each of the rows of the memory cell array, a pair of the first plurality of conductive material lines extend along the row and include portions that form control gates in each of the memory cells that are disposed adjacent to and insulated from the floating gates.

45. The method of claim 44, wherein for each of the rows:

the first strap cells include contact leads extending from the pair of first plurality of conductive material lines traversing therethrough, and each of the first plurality of conductive metal contacts is attached to one of the contact leads and is disposed between the pair of the first plurality of conductive material lines.

46. The method of claim 40, wherein:

the formation of the first strap cells includes forming contact leads extending from the first plurality of conductive material lines traversing therethrough, and the first plurality of conductive metal contacts are attached to the contact leads and each aligned to a center of one of the rows of memory cells.

47. The method of claim 40, wherein:

the first strap cells include contact leads extending from the first plurality of conductive material lines traversing therethrough, and each of the first plurality of conductive metal contacts is attached to one of the contact leads and is disposed within an effective width of one of the rows of memory cells.

48. The method of claim 40, wherein:

each of the first plurality of conductive material lines extends in the first direction and continuously along a length of one of the memory cell rows; and each of the second plurality of conductive material lines extends in the first direction.

49. The method of claim 48, further comprising the steps of:

forming a first plurality of metal conduit each of which extending in the first direction and along a length of one of the first plurality of conductive material lines and electrically connected thereto by at least one of the first plurality of conductive metal contacts; and forming a second plurality of metal conduit each of which extending in the first direction and electrically connected to one of the second plurality of conductive material lines by at least one of the second plurality of conductive metal contacts.

50. The method of claim 26, wherein the formation of the first strap cells includes forming contact leads extending from the first plurality of conductive material lines traversing therethrough, and wherein the first plurality of conductive metal contacts are attached to the contact leads.

51. The method of claim 50, wherein the contact leads are L-shaped.

52. The method of claim 50, wherein the contact leads are linearly shaped.

* * * * *